(12) United States Patent
Jiang et al.

(10) Patent No.: US 11,121,293 B2
(45) Date of Patent: Sep. 14, 2021

(54) LED LIGHT BULB HAVING FILAMENT WITH TUBE LIGHT CONVERSION LAYER

(71) Applicant: JIAXING SUPER LIGHTING ELECTRIC APPLIANCE CO., LTD, Jiaxing (CN)

(72) Inventors: Tao Jiang, Jiaxing (CN); Weihong Xu, Jiaxing (CN); Yukihiro Saito, Jiaxing (CN); Hayato Unagike, Jiaxing (CN); Aiming Xiong, Jiaxing (CN); Junfeng Xu, Jiaxing (CN); Yiching Chen, Taichung (TW)

(73) Assignee: JIAXING SUPER LIGHTING ELECTRIC APPLIANCE CO., LTD, Zhejiang (CN)

( * ) Notice: Subject to any disclaimer, the term of this patent is extended or adjusted under 35 U.S.C. 154(b) by 25 days.

(21) Appl. No.: 16/595,401

(22) Filed: Oct. 7, 2019

(65) Prior Publication Data

US 2020/0035878 A1 Jan. 30, 2020

Related U.S. Application Data

(63) Continuation of application No. 16/479,220, filed as application No. PCT/CN2018/123818 on Dec. 26, 2018, now Pat. No. 10,790,419.

(30) Foreign Application Priority Data

Dec. 26, 2017 (CN) .......................... 201711434993.3
Dec. 29, 2017 (CN) .......................... 201711477767.3
(Continued)

(51) Int. Cl.
*H01L 33/50* (2010.01)
*F21K 9/237* (2016.01)
(Continued)

(52) U.S. Cl.
CPC ............ *H01L 33/508* (2013.01); *F21K 9/237* (2016.08); *H01L 25/0753* (2013.01); *H01L 33/501* (2013.01); *H01L 33/62* (2013.01)

(58) Field of Classification Search
CPC . H01L 33/508; H01L 25/0753; H01L 33/501; H01L 33/62; H01L 33/00;
(Continued)

(56) References Cited

U.S. PATENT DOCUMENTS 8,455,895 B2 * 6/2013 Chai .................. H01L 25/0753
257/98
8,933,619 B1 * 1/2015 Ou ......................... F21K 9/232
313/317

(Continued)

FOREIGN PATENT DOCUMENTS

CN 202209551 U 5/2012
CN 202719450 U 2/2013
(Continued)

*Primary Examiner* — Andrew J Coughlin
*Assistant Examiner* — Jessica M Apenteng
(74) *Attorney, Agent, or Firm* — Simon Kuang Lu

(57) ABSTRACT

An LED light bulb, consisting of: a lamp housing; a bulb base connected to the lamp housing; a stem connected to the bulb base and located in the lamp housing, a single LED filament, disposed in the lamp housing, the LED filament comprising: two conductive supports, each of the two conductive supports connected with the stem and the flexible LED filament; a driving circuit, electrically connected with both the two conductive supports and the bulb base; and a plurality of supporting arms, each of the supporting arms comprise a first end and a second end opposite to the first end of the supporting arms, the first end of each of the supporting arms is connected with the stand while the second end of each of the supporting arms is connected with the LED filament; where anodes of LED sections are electrically connected together to serve as a first positive electrode P1

(Continued)

and/or a second positive electrode P2 of the flexible LED filament, cathodes of LED section serve as a first negative electrode N1 and/or a second negative electrode N2, respectively, where the positive electrode P1 and/or the second positive electrode P2, the first negative electrode N1 and/or the second negative electrode N2 are separately electrically connected to the driving circuit through the conductive supports.

19 Claims, 23 Drawing Sheets

(30) Foreign Application Priority Data

| Date | | Number |
|---|---|---|
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |

(51) Int. Cl.
*H01L 25/075* (2006.01)
*H01L 33/62* (2010.01)

(58) Field of Classification Search
CPC ....... H01L 33/505; H01L 33/54; F21K 9/237; F21K 9/232; F21K 9/61; H05B 45/00; F21V 15/04; F21Y 2115/10; F21Y 2107/70
USPC .......................................................... 362/84
See application file for complete search history.

(56) References Cited

U.S. PATENT DOCUMENTS

| | | | |
|---|---|---|---|
| 9,016,900 | B2 | 4/2015 | Takeuchi et al. |
| 9,488,767 | B2 | 11/2016 | Fukino |
| 9,761,765 | B2 | 9/2017 | Basin et al. |
| 2004/0008525 | A1 | 1/2004 | Shibata |
| 2009/0184618 | A1 | 7/2009 | Hakata et al. |
| 2012/0119647 | A1 | 5/2012 | Hsu |
| 2012/0281411 | A1 | 11/2012 | Kajiya et al. |
| 2013/0058080 | A1 | 3/2013 | Ge et al. |
| 2013/0058580 | A1 | 3/2013 | Ge et al. |
| 2013/0147348 | A1 | 6/2013 | Motoya et al. |
| 2013/0235592 | A1 | 9/2013 | Takeuchi et al. |
| 2013/0265796 | A1 | 10/2013 | Kwisthout |
| 2013/0293098 | A1 | 11/2013 | Li et al. |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0238199 | A1 | 8/2016 | Yeung et al. |
| 2016/0377237 | A1 | 12/2016 | Zhang |
| 2017/0012177 | A1 | 1/2017 | Trottier |
| 2017/0016582 | A1 | 1/2017 | Yang et al. |
| 2017/0138542 | A1 | 5/2017 | Gielen et al. |
| 2017/0167663 | A1 | 6/2017 | Hsiao et al. |
| 2017/0167711 | A1 | 6/2017 | Kadijk |

FOREIGN PATENT DOCUMENTS

| | | |
|---|---|---|
| CN | 101968181 B | 3/2013 |
| CN | 202834823 U | 3/2013 |
| CN | 103123949 A | 5/2013 |
| CN | 203367275 U | 12/2013 |
| CN | 103560128 A | 2/2014 |
| CN | 103682042 A | 3/2014 |
| CN | 203477967 U | 3/2014 |
| CN | 103890481 A | 6/2014 |
| CN | 203628391 U | 6/2014 |
| CN | 203628400 U | 6/2014 |
| CN | 203656627 U | 6/2014 |
| CN | 103939758 A | 7/2014 |
| CN | 203771136 U | 8/2014 |
| CN | 203857313 U | 10/2014 |
| CN | 203910792 U | 10/2014 |
| CN | 204062539 U | 12/2014 |
| CN | 104295945 A | 1/2015 |
| CN | 104319345 A | 1/2015 |
| CN | 204083941 U | 1/2015 |
| CN | 204153513 U | 2/2015 |
| CN | 104456165 A | 3/2015 |
| CN | 204289439 U | 4/2015 |
| CN | 104600174 A | 5/2015 |
| CN | 104600181 A | 5/2015 |
| CN | 104716247 A | 6/2015 |
| CN | 104913217 A | 9/2015 |
| CN | 105090789 A | 11/2015 |
| CN | 105098032 A | 11/2015 |
| CN | 105140381 A | 12/2015 |
| CN | 105161608 A | 12/2015 |
| CN | 204986570 U | 1/2016 |
| CN | 106468405 A | 3/2017 |
| CN | 106898681 A | 6/2017 |
| CN | 107123641 A | 9/2017 |
| CN | 107314258 A | 11/2017 |
| CN | 206973307 U | 2/2018 |
| CN | 105090782 B | 7/2018 |
| CN | 207849021 U | 9/2018 |
| EP | 2535640 A1 | 12/2012 |
| EP | 2760057 A1 | 7/2014 |
| EP | 2567145 B1 | 4/2016 |
| GB | 2547085 A | 8/2017 |
| JP | 2001126510 A | 5/2001 |
| JP | 2003037239 A | 2/2003 |
| WO | 2014167458 A1 | 10/2014 |
| WO | 2017037010 A1 | 3/2017 |

\* cited by examiner

LED LIGHT BULB HAVING FILAMENT WITH TUBE LIGHT CONVERSION LAYER

CROSS-REFERENCE TO RELATED APPLICATIONS

This application is a continuation application of U.S. application Ser. No. 16/479,220 filed on 2019 Jul. 19, which claims priority to Chinese Patent Applications No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety.

TECHNICAL FIELD

The present disclosure relates to a lighting field, and more particularly to an LED light bulb having filament with tube light conversion layer.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may results in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

Patent No. CN202252991U discloses the light lamp employing with a flexible PCB board instead of the aluminum heat dissipation component to improve heat dissipation.

Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omni-directional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

It is another object of the claimed invention to provide an LED light bulb, an LED light bulb includes a lamp housing, a lamp cap, two conductive brackets, a stem, and an LED filament. The lamp cap is electrically connected to the lamp housing, the two conductive brackets are disposed in the lamp housing, the stem extends from the lamp cap into the lamp housing, and the LED filament comprises a plurality of LED chips and two conductive electrodes. The LED chips are arranged in an array along the extending direction of the LED filaments, and the two conductive electrodes are respectively disposed at two ends of the LED filament and electrically connected to the LED chips, and the two conductive electrodes are respectively electrically connected to two conductive brackets. Wherein the LED filament is curled to satisfy symmetry characteristics in which: while a top view of the LED light bulb is presented in two dimensional coordinate system defining four quadrants with a X-axis crossing the stem, an Y-axis crossing the stem, and an origin, a brightness presented by a portion of the LED filament in the first quadrant in the top view is symmetric to a brightness presented by a portion of the LED filament in the second quadrant in the top view with respect to the Y-axis and/or is symmetric to a brightness presented by a portion of the LED filament in the third quadrant in the top view with respect to the origin; and while a side view of the LED light bulb is presented in two dimensional coordinate system defining four quadrants with a Y'-axis aligned with the stem, an X'-axis crossing the Y'-axis, and an origin, a brightness presented by a portion of the LED filament in the first quadrant in the side view is symmetric to a brightness presented by a portion of the LED filament in the second quadrant in the side view with respect to the Y'-axis.

In accordance with an embodiment of the present invention, an LED light bulb includes a lamp housing, a lamp caps, two conductive brackets, a stem and an LED filament. Wherein, the lamp cap is electrically connected to the lamp housing, the two conductive brackets are disposed in the lamp housing, and the stem extends from the lamp cap into the lamp housing. Moreover, the LED filament comprises a plurality of LED chips and two conductive electrodes. The LED chips are arranged in an array along the extending direction of the LED filaments, and the two conductive electrodes are respectively disposed at two ends of the LED filament and connected to the LED chips, and the two conductive electrodes are respectively connected two conductive brackets. Wherein the LED filament is curled to satisfy symmetry while a top view of the LED light bulb is presented in two dimensional coordinate system defining four quadrants with a X-axis crossing the stem, an Y-axis crossing the stem, and an origin, a structure of a portion of the LED filament in the first quadrant in the top view is symmetric to a structure of a portion of the LED filament in the second quadrant in the top view with respect to the Y-axis and/or is symmetric to a structure of a portion of the LED filament in the third quadrant in the top view with respect to the origin; and while a side view of the LED light bulb is presented in two dimensional coordinate system defining four quadrants with a Y'-axis aligned with the stem, an X'-axis crossing the Y'-axis, and an origin, a structure of a portion of the LED filament in the first quadrant in the side view is symmetric to a structure of a portion of the LED filament in the second quadrant in the side view with respect to the Y'-axis.

In accordance with an embodiment of the present invention, a perspective diagram of the light emission spectrum of an LED light bulb is provided. The LED light bulb may be any LED light bulb disclosed in the previous embodiments, the spectral distribution of the LED light bulb is mainly between the wavelength range of about 400 nm to 800 nm. Moreover, there are three peak wavelengths P1, P2, P3 in wavelength ranges corresponding to the light emitted by the LED light bulb. The wavelength of the peak value P1 is between about 430 nm and 480 nm, the wavelength of the peak value P2 is between about 580 nm and 620 nm, and the wavelength of the peak value peak P3 is between about 680 nm and 750 nm. The light intensity of the peak P1 is less than that of the peak P2, and the light intensity of the peak P2 is less than the light intensity of the peak P3.

It is another object of the claimed invention to provide an LED power supply module, the power supply module is disposed in the lamp cap of an LED light bulb, and the power supply module includes a rectifying circuit, a filtering circuit, and a driving circuit. The rectifying circuit is electrically connected to the first pad and the second pad to receive an external driving signal. The first pad and the second pad are respectively connected to the first area and the second area of the lamp cap, wherein the first area and the second area are electrically isolation. The rectifying circuit is configured to rectify an external driving signal to output a rectified signal. The filtering circuit is electrically connected to the rectifying circuit for filtering the rectified signal and generating a filtered signal accordingly. The driving circuit is electrically connected to the filtering circuit and the LED light emitting part, and for performing power conversion on the filtered signal and accordingly generating a driving power source, wherein the LED light emitting part is illuminated in response to the driving power source. According to the present invention employs the above technical schemes, therefore at least one or any combination of the following beneficial effects can be achieved.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1:
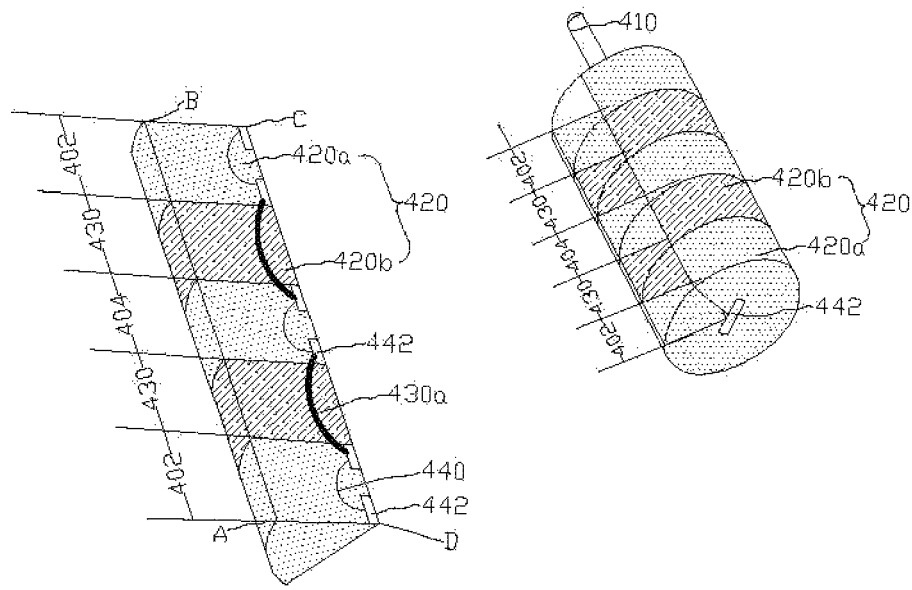
FIG. 1 is a perspective view of an LED filament with partial cutaway in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 2:
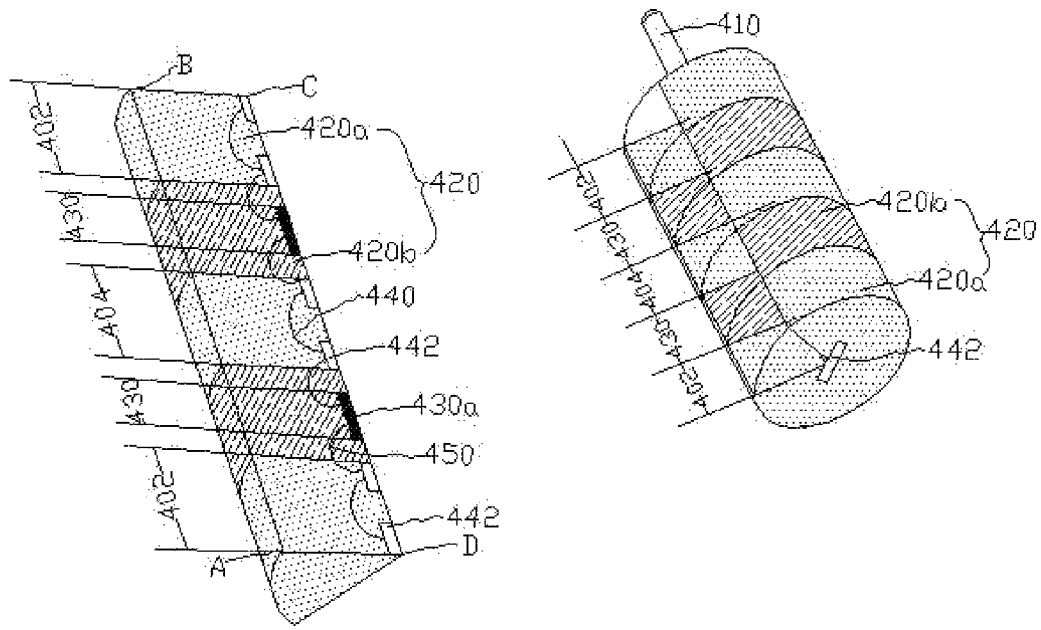
FIG. 2 is a perspective view of an LED filament with partial cutaway in accordance with an embodiment of the present invention.

In an embodiment, the tubular encapsulation of the LED filament is a monolithic structure. In some embodiments, the monolithic structure shares a uniform set of chemical and physical properties throughout the entire structure. Being structurally indivisible, the monolithic structure need not be a uniform structure. In other embodiments, the monolithic structure includes a first portion and a second portion having a different property from the first portion. In another embodiment, the tubular encapsulation includes a set of otherwise divisible layers or divisible columns interconnected to form a unitary structure of the tubular encapsulation. In FIGS. 1 and 2, the tubular encapsulation of an LED filament includes a set of interconnected divisible columns configured to form a unitary structure of the tubular encapsulation. Referring to FIG. 1, the LED filament 400 is further cut into two parts to schematically show its internal structure. Wherein the set of interconnected divisible columns includes a plurality of alternating columns and each column can be configured to a first light conversion layer 420a or a second light conversion layer 420b. The tubular encapsulation of the LED filament includes at least one LED section 402, 404, a plurality of columns 420, at least one conductive section 430 and at least one conductive electrode 410. The conductive section 430 is located between the adjacent two LED sections 402, 404. The conductive electrode 410 is electrically connected to the LED section 402/404. The LED sections 402, 404 are enclosed by the column of first light conversion layer 420a, and the conductive section 430 is enclosed by the column of second light conversion layer 420b. In one embodiment, the LED sections 402/404 include a plurality of LED chips 442. The adjacent two LED sections 402, 404 are electrically connected by the conductive section 430, and the conductive section 430 includes a conductor 430a. The conductor 430a is mainly disposed in the conductive section 430 and two ends of conductor 430a are disposed in the adjacent sections 402, 404. In another embodiment, the LED chips 442 are disposed in the LED sections 402/404 and both ends of the conductor 430a for connecting the two shortest distance LED chips in the adjacent two LED sections 402, 404 are disposed in the conductive section 430. In another embodiment, LED chips 442 are disposed in LED sections 402/404. A portion of the conductor 430a for electrically connecting the adjacent two LED sections 402, 404 is disposed in the first light conversion layer 420a, and another portion is disposed in the second light conversion layer 420b. The properties of the first light conversion layer 420a and the second light conversion layer 420b may be different, depending on the advantages an LED filament is expected to pursue. Wherein the properties such as the converted wavelength, size of integrated particle, thickness, transmittance, hardness, composition ratio, etc. In one embodiment, the first light conversion layer 420a is harder than the second light conversion layer 420b, and the first light conversion layer 420a is filled with more phosphor particles than the second light conversion layer 420b. Because the first light conversion layer 420a is a relatively harder layer, it is configured to better protection of the linear array of LED sections 402/404 and ensuring that the LED light bulb does not malfunction when the LED filament is bent to maintain a desired posture in the LED light bulb. The second light conversion layer 420b is a relatively softer layer so that the entire LED filament is bent with posture in the LED light bulb to produce omni-directional light, especially one single LED filament producing omni-directional light. In another embodiment, the first light conversion layer 420a has a better thermal conductivity than the second light conversion layer 420b, such as more heat dissipating particles added to the first light conversion layer 420a than the second light conversion layer 420b. The first light conversion layer 420a having a higher thermal conductivity can conduct heat generated from the LED sections out of the LED filament, thereby the linear array of LED sections has better protection free from degradation or burning. Because of the conductive section 430 and the LED section 402/404 are interval disposed and the conductive section 430 further acts less than the LED sections 402/404 in terms of the heat conduction. Therefore, when the second light conversion layer 420b is contained with less heat dissipating particles than the first light conversion layer 420a, the cost of manufacturing of the LED filament can be saved. The size ratio of each columns of the first light conversion layer 420a enclosing the LED sections 402/404 and the tubular encapsulation of the LED filament is determined by reference factors such as light conversion capability, bendability, thermal conductivity. Other cases are the same, the larger volume of the first light conversion layer 420a in compare with the entire tubular encapsulation of the LED filament, the LED filament has greater light conversion capability and thermal conductivity, but will not be easy to be bent. The circumferential surface of the entire tubular encapsulation of the LED filament shows a combination surface of the first light conversion layer 420a and other regions. A ratio R5 is defined as the ratio of the circumferential surface of the first light conversion layer 420a to the total circumferential surface of the entire tubular encapsulation of the LED filament. Preferably, the ratio R5 is from 0.2 to 0.8. Preferably, the ratio R5 is in a range of around 0.4 to 0.6.

In the structure of the LED filament 400 shown in FIG. 2 is similar to FIG. 1, the difference is the placement of the second wire 450. The LED chips 442 are disposed in each LED sections 402/404. The LED sections 402, 404 are electrically connected to the conductive sections 430 or the LED chips 442 of the LED sections 402/404, for example, electrically connected by a first wire 440 and a second wire 450, and the second wire 450 is disposed in the conductive section 430. In another embodiment, a portion of certain LED chips 442 in the LED sections 402/404 are enclosed in the LED sections 402/404. Both ends of the wire for connecting the two shortest distance LED chips in the adjacent two LED sections 402, 404 are disposed in the second light conversion layer 420b, that is, the second wire is disposed in the second light conversion layer 420b. In another embodiment, the LED chips 442 are enclosed in the LED sections 402/404. A portion of the second wire 450 for electrically connecting the adjacent LED chip 442 and the conductor 430a is disposed in the first light conversion layer 420a, and another portion of the second wire 450 is disposed in the second light conversion layer 420b.

The LED chip used in the aforementioned embodiments can be replaced by a back plated chip, and the plated metal is silver or gold alloy. When the back plated chip is used, the specular reflection can be enhanced, and the luminous flux of the light emitted from the light emitting surface A of the LED chip can be increased.

The LED filament structure in the aforementioned embodiments is mainly applicable to the LED light bulb product, so that the LED light bulb can achieve the omni-directional light illuminating effect through the flexible bending characteristics of the single LED filament. The specific embodiment in which the aforementioned LED filament applied to the LED light bulb is further explained below.

Figure 3A:
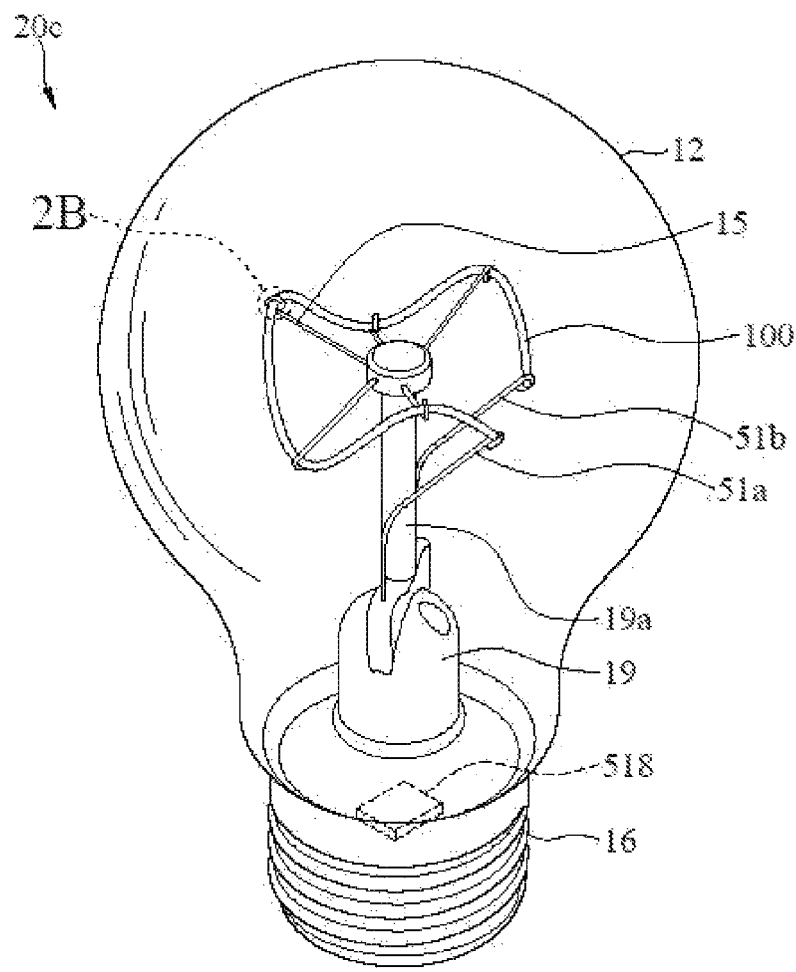
FIG. 3A illustrates a perspective view of an LED light bulb according to the third embodiment of the instant disclosure.

Please refer to FIG. 3A. FIG. 3A illustrates a perspective view of an LED light bulb according to the third embodiment of the present disclosure. According to the third embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 3A is bent to form a contour resembling to a circle while being observed from the top view of FIG. 3A. According to the embodiment of FIG. 3A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 3B:
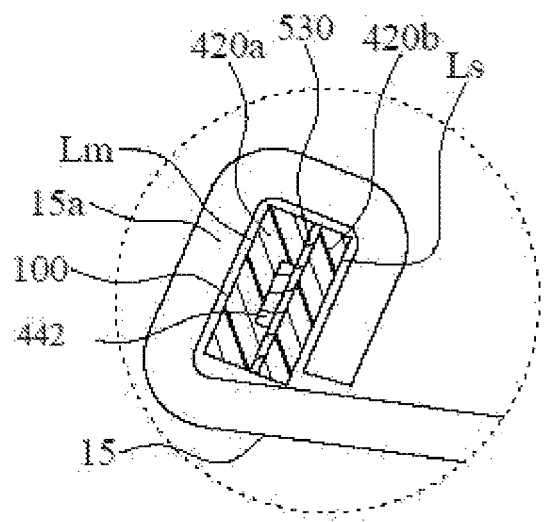
FIG. 3B illustrates an enlarged cross-sectional view of the dashed-line circle of FIG. 3A.

Please refer to FIG. 3B which illustrates an enlarged cross-sectional view of the dashed-line circle of FIG. 3A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15a fits the outer shape of the cross section of the LED filament 100; therefore, based upon a proper design, the cross section of the LED filament 100 may be oriented to face towards a predetermined orientation. For example, as shown in FIG. 3B, the LED filament 100 comprises a top layer 420a, LED chips 104, and a base layer 420b. The LED chips 104 are aligned in line along the axial direction (or an elongated direction) of the LED filament 100 and are disposed between the top layer 420a and the base layer 420b. The top layer 420a of the LED filament 100 is oriented to face towards ten o'clock in FIG. 3B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420a away from the base layer 420b is the main lighting face Lm, and a face of the base layer 420b away from the top layer 420a is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 3A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 3A) requires only two joint points respectively formed on the two conductive electrodes, which effectively lowers the risk of fault welding and simplifies the process of connection comparing to the mechanically connection in the tightly pressing manner.

Figure 3C:
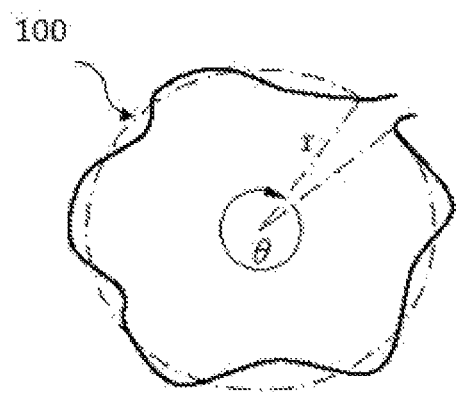
FIG. 3C is a projection of a top view of an LED filament of the LED light bulb of FIG. 3A.

Please refer to FIG. 3C. FIG. 3C is a projection of a top view of an LED filament of the LED light bulb 20c of FIG. 3A. As shown in FIG. 3C, in an embodiment, the LED filament may be curved to form a wave shape resembling to a circle observed in a top view to surround the center of the light bulb or the stem. In different embodiments, the LED filament observed in the top view can form a quasi-circle or a quasi U shape.

As shown in FIG. 3B and FIG. 3C, the LED filament 100 surrounds with the wave shape resembling to a circle and has a quasi-symmetric structure in the top view, and the lighting face of the LED filament 100 is also symmetric, e.g., the main lighting face Lm in the top view may faces outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20c as a whole may generate an effect of an omnidirectional light close to a 360 degrees illumination. Additionally, the two joint points may be close to each other such that the conductive supports 51a, 51b are substantially below the LED filament 100. Visually, the conductive supports 51a, 51b keeps a low profile and is integrated with the LED filament 100 to show an elegance curvature.

Figure 4A:
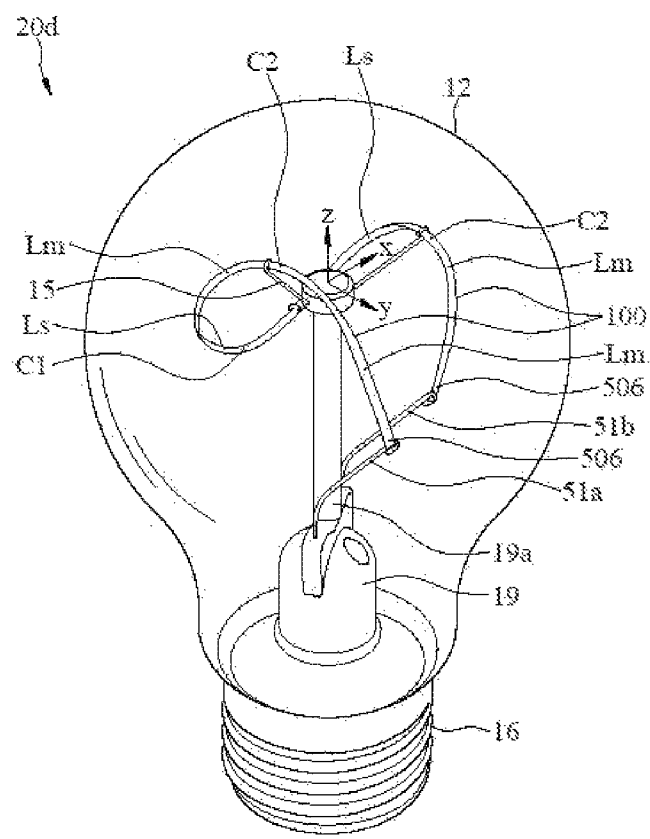
FIG. 4A is a perspective view of an LED light bulb according to an embodiment of the present invention.
Figure 4B:
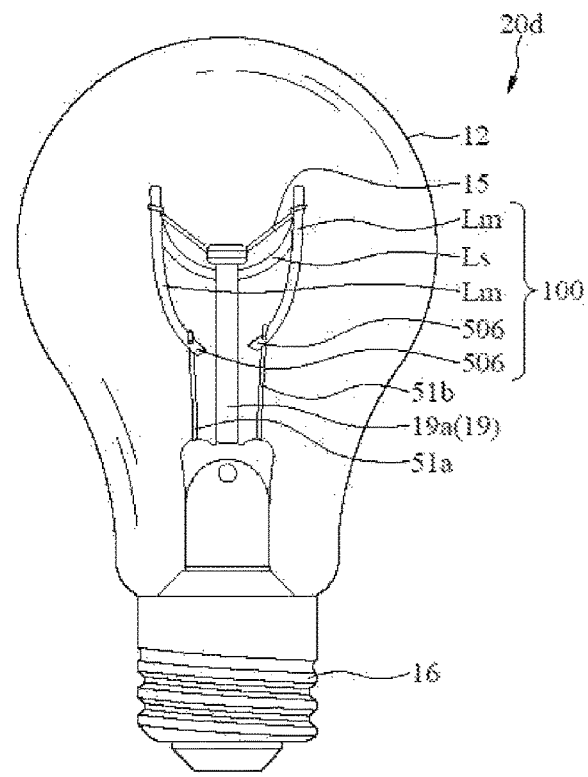
FIG. 4B is a front view of an LED light bulb of FIG. 4A.

Please refer to FIG. 4A and FIG. 4B. FIG. 4A is a perspective view of an LED light bulb according to an embodiment of the present invention. FIG. 4B is a front view (or a side view) of an LED light bulb of FIG. 4A. The LED light bulb 20d shown in FIG. 4A and FIG. 4B is analogous to the LED light bulb 20c shown in FIG. 3A. As shown in FIG. 4A and FIG. 4B, the LED light bulb 20d comprises a bulb shell 12, a bulb base 16 connected to the bulb shell 12, two conductive supports 51a, 51b disposed in the bulb shell 12, supporting arms 15, a stem 19, and one single LED filament 100. The stem 19 comprises a stem bottom and a stem top opposite to each other. The stem bottom is connected to the bulb base 16. The stem top extends to inside of the blub shell 12 (e.g., extending to the center of the bulb shell 12) along an elongated direction of the stem 19. For example, the stem top may be substantially located at a center of the inside of the bulb shell 12. In the embodiment, the stem 19 comprises the stand 19a. Herein the stand 19a is deemed as a part of the whole stem 19 and thus the top of the stem 19 is the same as the top of the stand 19a. The two conductive supports 51a, 51b are connected to the stem 19. The LED filament 100 comprises a filament body and two conductive electrodes 506. The two conductive electrodes 506 are at two opposite ends of the filament body. The filament body is the part of the LED filament 100 without the conductive electrodes 506. The two conductive electrodes 506 are respectively connected to the two conductive supports 51a, 51b. The filament body is around the stem 19. An end of the supporting arm 15 is connected to the stem 19 and another end of the supporting arm 15 is connected to the filament body.

Figure 4C:
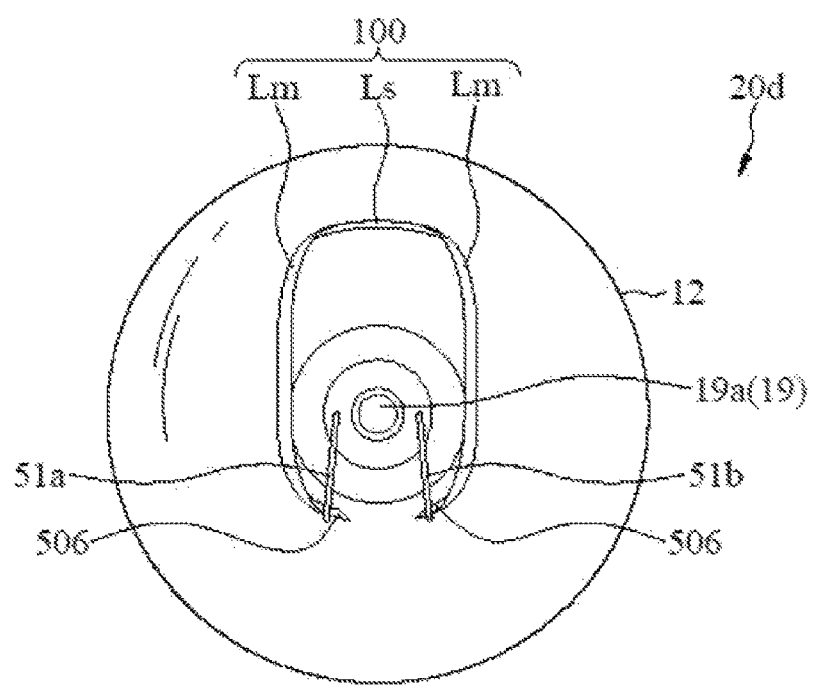
FIG. 4C is a top view of the LED light bulb of FIG. 4A.

Please refer to FIG. 4C. FIG. 4C is a top view of the LED light bulb 20d of FIG. 4A. As shown in FIG. 4B and FIG. 4C, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20d or towards the center of the bulb shell 12. In other words, when a user observes the LED light bulb 20d from outside, the user would see the main lighting face Lm of the LED filament 100d at any angle. Based upon the configuration, the effect of illumination is better.

According to different embodiments, the LED filament 100 in different LED light bulbs (e.g., the LED light bulb 20a, 20b, 20c, or 20d) may be formed with different shapes or curves while all of the LED filaments 100 are configured to have symmetry characteristic. The symmetry characteristic is beneficial of creating an even, wide distribution of light rays, so that the LED light bulb is capable of generating an omnidirectional light effect. The symmetry characteristic of the LED filament 100 is discussed below.

The definition of the symmetry characteristic of the LED filament 100 may be based on four quadrants defined in a top view of an LED light bulb. The four quadrants may be defined in a top view of an LED light bulb (e.g., the LED light bulb 20c shown in FIG. 3A), and the origin of the four quadrants may be defined as a center of a stem/stand of the LED light bulb in the top view (e.g., a center of the top of the stand 19a shown in FIG. 3A). The LED filament of the LED light bulb (e.g., the LED filaments 100 shown in FIG. 3A) in the top view may be presented as an annular structure, shape or, contour. The LED filament presented in the four quadrants in the top view may be symmetric.

For example, the brightness presented by a portion of the LED filament in the first quadrant in the top view is symmetric with that presented by a portion of the LED filament in the second quadrant, in the third quadrant, or in the fourth quadrant in the top view while the LED filament operates. In some embodiments, the structure of a portion of the LED filament in the first quadrant in the top view is symmetric with that of a portion of the LED filament in the second quadrant, in the third quadrant, or in the fourth quadrant in the top view. In addition, an emitting direction of a portion of the LED filament in the first quadrant in the top view is symmetric with that of a portion of the LED filament in the second quadrant, in the third quadrant, or in the fourth quadrant in the top view.

In another embodiment, an arrangement of LED chips in a portion of the LED filament in the first quadrant (e.g., a density variation of the LED chips in the portion of the LED filament in the first quadrant) in the top view is symmetric with an arrangement of LED chips in a portion of the LED filament in the second quadrant, in the third quadrant, or in the fourth quadrant in the top view.

In another embodiment, a power configuration of LED chips with different power in a portion of the LED filament in the first quadrant in the top view is symmetric with a power configuration of LED chips with different power in a portion of the LED filament in the second quadrant, in the third quadrant, or in the fourth quadrant in the top view.

In another embodiment, refractive indexes of segments of a portion of the LED filament in the first quadrant in the top view are symmetric with refractive indexes of segments of a portion of the LED filament in the second quadrant, in the third quadrant, or in the fourth quadrant in the top view while the segments may be defined by distinct refractive indexes.

In another embodiment, surface roughness of segments of a portion of the LED filament in the first quadrant in the top view are symmetric with surface roughness of segments of a portion of the LED filament in the second quadrant, in the third quadrant, or in the fourth quadrant in the top view while the segments may be defined by distinct surface roughness.

The LED filament presented in the four quadrants in the top view may be in point symmetry (e.g., being symmetric with the origin of the four quadrants) or in line symmetry (e.g., being symmetric with one of the two axis the four quadrants).

A tolerance (a permissible error) of the symmetric structure of the LED filament in the four quadrants in the top view may be up to 20%-50%. For example, in a case that the structure of a portion of the LED filament in the first quadrant is symmetric with that of a portion of the LED filament in the second quadrant, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in one of the four quadrants in the top view is substantially equal to that of a portion of the LED filament in another one of the four quadrants in the top view. The lengths of portions of the LED filament in different quadrants in the top view may also have 20%-50% difference.

The definition of the symmetry characteristic of the LED filament 100 may be based on four quadrants defined in a side view, in a front view, or in a rear view of an LED light bulb. In the embodiments, the side view may include a front view or a rear view of the LED light bulb. The four quadrants may be defined in a side view of an LED light bulb (e.g., the LED light bulb 20c shown in FIG. 3A). In such case, an elongated direction of a stand (or a stem) from the bulb base 16 towards a top of the bulb shell 12 away from the bulb base 16 may be defined as the Y-axis, and the X-axis may cross a middle of the stand (e.g., the stand 19a of the LED light bulb 20c shown in FIG. 3A) while the origin of the four quadrants may be defined as the middle of the stand. In different embodiment, the X-axis may cross the stand at any point, e.g., the X-axis may cross the stand at the top of the stand, at the bottom of the stand, or at a point with a certain height (e.g., ⅔ height) of the stand.

In addition, portions of the LED filament presented in the first quadrant and the second quadrant (the upper quadrants) in the side view may be symmetric (e.g., in line symmetry with the Y-axis) in brightness, and portions of the LED filament presented in the third quadrant and the fourth quadrant (the lower quadrants) in the side view may be symmetric (e.g., in line symmetry with the Y-axis) in brightness; however, the brightness of the portions of the LED filament presented in the upper quadrants in the side view may be asymmetric with that of the portions of the LED filament presented in the lower quadrants in the side view.

In some embodiments, portions of the LED filament presented in the first quadrant and the second quadrant (the upper quadrants) in the side view may be symmetric (e.g., in line symmetry with the Y-axis) in structure; portions of the LED filament presented in the third quadrant and the fourth quadrant (the lower quadrants) in the side view may be symmetric (e.g., in line symmetry with the Y-axis) in structure. In addition, an emitting direction of a portion of the LED filament in the first quadrant in the side view is symmetric with that of a portion of the LED filament in the second quadrant in the side view, and an emitting direction of a portion of the LED filament in the third quadrant in the side view is symmetric with that of a portion of the LED filament in the fourth quadrant in the side view.

In another embodiment, an arrangement of LED chips in a portion of the LED filament in the first quadrant in the side view is symmetric with an arrangement of LED chips in a portion of the LED filament in the second quadrant in the side view, and an arrangement of LED chips in a portion of the LED filament in the third quadrant in the side view is symmetric with an arrangement of LED chips in a portion of the LED filament in the fourth quadrant in the side view.

In another embodiment, a power configuration of LED chips with different power in a portion of the LED filament in the first quadrant in the side view is symmetric with a power configuration of LED chips with different power in a portion of the LED filament in the second quadrant in the side view, and a power configuration of LED chips with different power in a portion of the LED filament in the third quadrant in the side view is symmetric with a power configuration of LED chips with different power in a portion of the LED filament in the fourth quadrant in the side view.

In another embodiment, refractive indexes of segments of a portion of the LED filament in the first quadrant in the side view are symmetric with refractive indexes of segments of a portion of the LED filament in the second quadrant in the side view, and refractive indexes of segments of a portion of the LED filament in the third quadrant in the side view are symmetric with refractive indexes of segments of a portion of the LED filament in the fourth quadrant in the side view while the segments may be defined by distinct refractive indexes.

In another embodiment, surface roughness of segments of a portion of the LED filament in the first quadrant in the side view are symmetric with surface roughness of segments of a portion of the LED filament in the second quadrant in the side view, and surface roughness of segments of a portion of the LED filament in the third quadrant in the side view are symmetric with surface roughness of segments of a portion of the LED filament in the fourth quadrant in the side view while the segments may be defined by distinct surface roughness.

Additionally, the portions of the LED filament presented in the upper quadrants in the side view may be asymmetric with the portions of the LED filament presented in the lower quadrants in the side view in brightness. In some embodiments, the portion of the LED filament presented in the first quadrant and the fourth quadrant in the side view is asymmetric in structure, in length, in emitting direction, in arrangement of LED chips, in power configuration of LED chips with different power, in refractive index, or in surface roughness, and the portion of the LED filament presented in the second quadrant and the third quadrant in the side view is asymmetric in structure, in length, in emitting direction, in arrangement of LED chips, in power configuration of LED chips with different power, in refractive index, or in surface roughness. In order to fulfill the illumination purpose and the requirement of omnidirectional lamps, light rays emitted from the upper quadrants (the portion away from the bulb base 16) in the side view should be greater than those emitted from the lower quadrants (the portion close to the bulb base 16). Therefore, the asymmetric characteristic of the LED filament of the LED light bulb between the upper quadrants and the lower quadrants in the side view may contribute to the omnidirectional requirement by concentrating the light rays in the upper quadrants.

A tolerance (a permissible error) of the symmetric structure of the LED filament in the first quadrant and the second quadrant in the side view may be 20%-50%. For example, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in the first quadrant in the side view is substantially equal to that of a portion of the LED filament in the second quadrant in the side view. A length of a portion of the LED filament in the third quadrant in the side view is substantially equal to that of a portion of the LED filament in the fourth quadrant in the side view. However, the length of the portion of the LED filament in the first quadrant or the second quadrant in the side view is different from the length of the portion of the LED filament in the third quadrant or the fourth quadrant in the side view. In some embodiment, the length of the portion of the LED filament in the third quadrant or the fourth quadrant in the side view may be less than that of the portion of the LED filament in the first quadrant or the second quadrant in the side view. The lengths of portions of the LED filament in the first and the second quadrants or in the third and the fourth quadrants in the side view may also have 20%-50% difference.

Figure 4D:
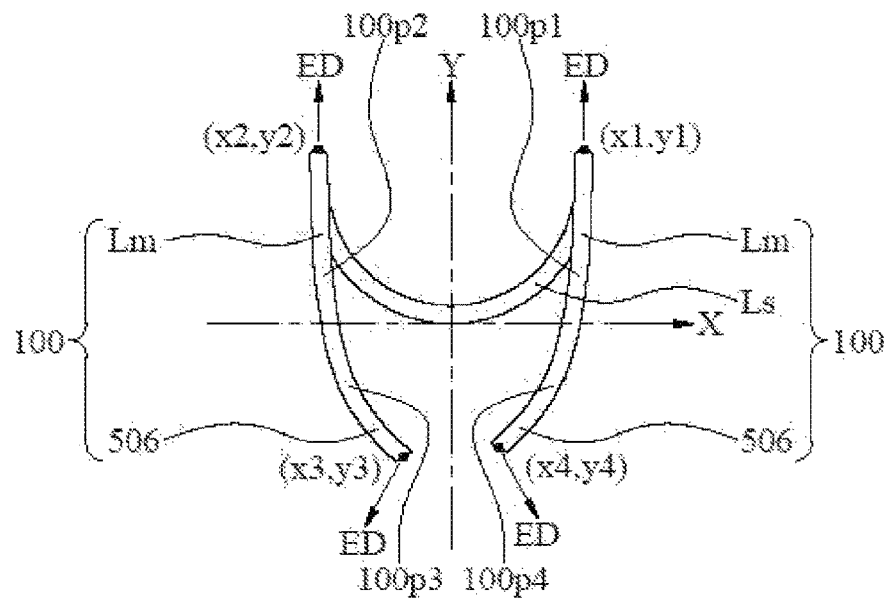
FIG. 4D is the LED filament shown in FIG. 4B presented in two dimensional coordinate system defining four quadrants.

Please refer to FIG. 4D. FIG. 4D is the LED filament 100 shown in FIG. 4B presented in two dimensional coordinate system defining four quadrants. The LED filament 100 in FIG. 4D is the same as that in FIG. 4B, which is a front view (or a side view) of the LED light bulb 20d shown in FIG. 4A. As shown in FIG. 4B and FIG. 4D, the Y-axis is aligned with the stand 19a of the stem (i.e., being along the elongated direction of the stand 19a), and the X-axis crosses the stand 19a (i.e., being perpendicular to the elongated direction of the stand 19a). As shown in FIG. 4D, the LED filament 100 in the side view can be divided into a first portion 100p1, a second portion 100p2, a third portion 100p3, and a fourth portion 100p4 by the X-axis and the Y-axis. The first portion 100p1 of the LED filament 100 is the portion presented in the first quadrant in the side view. The second portion 100p2 of the LED filament 100 is the portion presented in the second quadrant in the side view. The third portion 100p3 of the LED filament 100 is the portion presented in the third quadrant in the side view. The fourth portion 100p4 of the LED filament 100 is the portion presented in the fourth quadrant in the side view.

As shown in FIG. 4D, the LED filament 100 is in line symmetry. The LED filament 100 is symmetric with the Y-axis in the side view. That is to say, the geometric shape of the first portion 100p1 and the fourth portion 100p4 are symmetric with that of the second portion 100p2 and the third portion 100p3. Specifically, the first portion 100p1 is symmetric to the second portion 100p2 in the side view. Particularly, the first portion 100p1 and the second portion 100p2 are symmetric in structure in the side view with respect to the Y-axis. In addition, the third portion 100p3 is symmetric to the fourth portion 100p4 in the side view. Particularly, the third portion 100p3 and the fourth portion 100p4 are symmetric in structure in the side view with respect to the Y-axis.

In the embodiment, as shown in FIG. 4D, the first portion 100p1 and the second portion 100p2 presented in the upper quadrants (i.e., the first quadrant and the second quadrant) in the side view are asymmetric with the third portion 100p3 and the fourth portion 100p4 presented in the lower quadrants (i.e., the third quadrant and the fourth quadrant) in the side view. In particular, the first portion 100p1 and the fourth portion 100p4 in the side view are asymmetric, and the second portion 100p2 and the third portion 100p3 in the side view are asymmetric. According to an asymmetry characteristic of the structure of the filament 100 in the upper quadrants and the lower quadrants in FIG. 4D, light rays emitted from the upper quadrants to pass through the upper bulb shell 12 (the portion away from the bulb base 16) would be greater than those emitted from the lower quadrants to pass through the lower bulb shell 12 (the portion close to the bulb base 16) in order to fulfill the illumination purpose and the requirement of omnidirectional lamps.

Based upon symmetry characteristic of LED filament 100, the structures of the two symmetric portions of the LED filament 100 in the side view (the first portion 100p1 and the second portion 100p2 or the third portion 100p3 and the fourth portion 100p4) may be exactly symmetric or be symmetric with a tolerance in structure. The tolerance (or a permissible error) between the structures of the two symmetric portions of the LED filament 100 in the side view may be 20%-50% or less.

The tolerance can be defined as a difference in coordinates, i.e., x-coordinate or y-coordinate. For example, if there is a designated point on the first portion 100p1 of the LED filament 100 in the first quadrant and a symmetric point on the second portion 100p2 of the LED filament 100 in the second quadrant symmetric to the designated point with respect to the Y-axis, the absolute value of y-coordinate or the x-coordinate of the designated point may be equal to the absolute value of y-coordinate or the x-coordinate of the symmetric point or may have 20% difference comparing to the absolute value of y-coordinate or the x-coordinate of the symmetric point.

For example, as shown in FIG. 4D, a designated point (x1, y1) on the first portion 100p1 of the LED filament 100 in the first quadrant is defined as a first position, and a symmetric point (x2, y2) on the second portion 100p2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100p1 and the second portion 100p2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 4D, a designated point (x3, y3) on the third portion 100p3 of the LED filament 100 in the third quadrant is defined as a third position, and a symmetric point (x4, y4) on the fourth portion 100p4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100p3 and the fourth portion 100p4 are symmetric with a tolerance (e.g., a difference in coordinates being less than 20%) in structure. In other words, the absolute value of x4 of the symmetric point (x4, y4) is unequal to the absolute value of x3 of the designated point (x3, y3), and the absolute value of y4 of the symmetric point (x4, y4) is unequal to the absolute value of y3 of the designated point (x3, y3). As shown in FIG. 4D, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 4D, a length of the first portion 100p1 of the LED filament 100 in the first quadrant in the side view is substantially equal to a length of the second portion 100p2 of the LED filament 100 in the second quadrant in the side view. In the embodiment, the length is defined along an elongated direction of the LED filament 100 in a plane view (e.g., a side view, a front view, or a top view). For example, the first portion 100p1 elongates in the first quadrant in the side view shown in FIG. 4D to form a reversed "V" shape with two ends respectively contacting the X-axis and the Y-axis, and the length of the first portion 100p1 is defined along the reversed "V" shape between the X-axis and the Y-axis.

In addition, a length of the third portion 100p3 of the LED filament 100 in the third quadrant in the side view is substantially equal to a length of fourth portion 100p4 of the LED filament 100 in the fourth quadrant in the side view. Since the third portion 100p3 and the fourth portion 100p4 are symmetric with respect to the Y-axis with a tolerance in structure, there may be a slightly difference between the length of the third portion 100p3 and the length of fourth portion 100p4. The difference may be 20%-50% or less.

As shown in FIG. 4D, an emitting direction of a designated point of the first portion 100p1 and an emitting direction of a symmetric point of the second portion 100p2 symmetric to the designated point are symmetric in direction in the side view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100p1 has an emitting direction ED which is upwardly in FIG. 4D, and the symmetric point (x2, y2) of the second portion 100p2 has an emitting direction ED which is upwardly in FIG. 4D. The emitting direction ED of the designated point (x1, y1) and the emitting direction ED of the symmetric point (x2, y2) are symmetric with respect to the Y-axis. In addition, the designated point (x3, y3) of the third portion 100p3 has an emitting direction ED towards a lower-left direction in FIG. 4D, and the symmetric point (x4, y4) of the fourth portion 100p4 has an emitting direction ED towards a lower-right direction in FIG. 4D. The emitting direction ED of the designated point (x3, y3) and the emitting direction ED of the symmetric point (x4, y4) are symmetric with respect to the Y-axis.

Figure 4E:
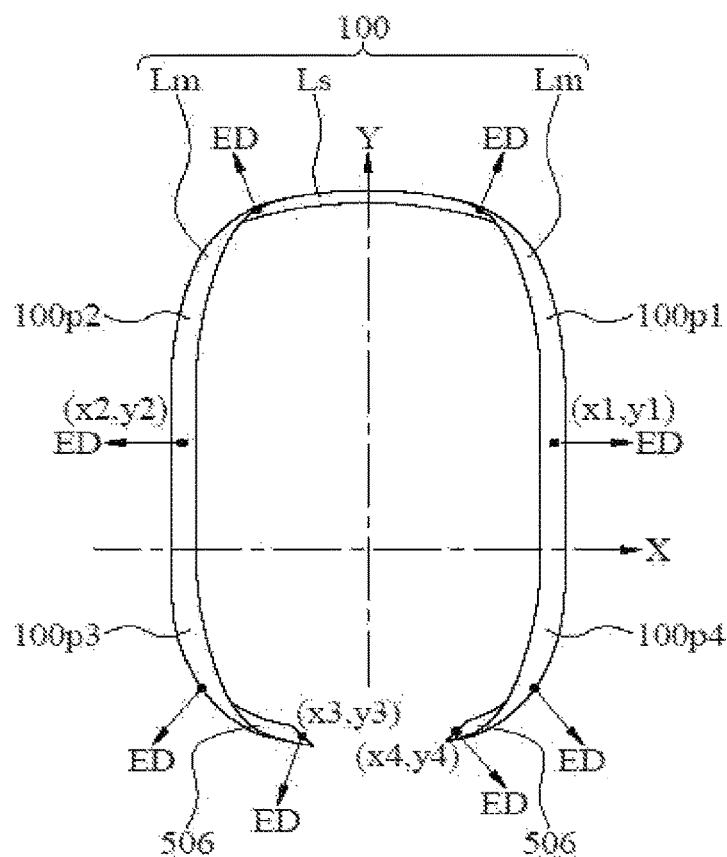
FIG. 4E is the LED filament shown in FIG. 4C presented in two dimensional coordinate system defining four quadrants.

Please refer to FIG. 4E. FIG. 4E is the LED filament 100 shown in FIG. 4C presented in two dimensional coordinate system defining four quadrants. The LED filament 100 in FIG. 4E is the same as that in FIG. 4C, which is a top view of the LED light bulb 20d shown in FIG. 4A. As shown in FIG. 4C and FIG. 4E, the origin of the four quadrants is defined as a center of a stand 19a of the LED light bulb 20d in the top view (e.g., a center of the top of the stand 19a shown in FIG. 4A). In the embodiment, the Y-axis is vertical, and the X-axis is horizontal in FIG. 4E. As shown in FIG. 4E, the LED filament 100 in the top view can be divided into a first portion 100p1, a second portion 100p2, a third portion 100p3, and a fourth portion 100p4 by the X-axis and the Y-axis. The first portion 100p1 of the LED filament 100 is the portion presented in the first quadrant in the top view. The second portion 100p2 of the LED filament 100 is the portion presented in the second quadrant in the top view. The third portion 100p3 of the LED filament 100 is the portion presented in the third quadrant in the top view. The fourth portion 100p4 of the LED filament 100 is the portion presented in the fourth quadrant in the top view.

In some embodiments, the LED filament 100 in the top view may be symmetric in point symmetry (being symmetric with the origin of the four quadrants) or in line symmetry (being symmetric with one of the two axis the four quadrants). In the embodiment, as shown in FIG. 4E, the LED filament 100 in the top view is in line symmetry. In particular, the LED filament 100 in the top view is symmetric with the Y-axis. That is to say, the geometric shape of the first portion 100p1 and the fourth portion 100p4 are symmetric with that of the second portion 100p2 and the third portion 100p3. Specifically, the first portion 100p1 is symmetric to the second portion 100p2 in the top view. Particularly, the first portion 100p1 and the second portion 100p2 are symmetric in structure in the top view with respect to the Y-axis. In addition, the third portion 100p3 is symmetric to the fourth portion 100p4 in the top view. Particularly, the third portion 100p3 and the fourth portion 100p4 are symmetric in structure in the top view with respect to the Y-axis.

Based upon symmetry characteristic of LED filament 100, the structures of the two symmetric portions of the LED filament 100 in the top view (the first portion 100p1 and the second portion 100p2 or the third portion 100p3 and the fourth portion 100p4) may be exactly symmetric or be symmetric with a tolerance in structure. The tolerance (or a permissible error) between the structures of the two symmetric portions of the LED filament 100 in the top view may be 20%-50% or less.

For example, as shown in FIG. 4E, a designated point (x1, y1) on the first portion 100p1 of the LED filament 100 in the first quadrant is defined as a first position, and a symmetric point (x2, y2) on the second portion 100p2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100p1 and the second portion 100p2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 4E, a designated point (x3, y3) on the third portion 100p3 of the LED filament 100 in the third quadrant is defined as a third position, and a symmetric point (x4, y4) on the fourth portion 100p4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100p3 and the fourth portion 100p4 are symmetric with a tolerance (e.g., a difference in coordinates being less than 20%) in structure. In other words, x4 of the symmetric point (x4, y4) is unequal to negative x3 of the designated point (x3, y3), and y4 of the symmetric point (x4, y4) is unequal to y3 of the designated point (x3, y3). As shown in FIG. 4E, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 4E, a length of the first portion 100p1 of the LED filament 100 in the first quadrant in the top view is substantially equal to a length of the second portion 100p2 of the LED filament 100 in the second quadrant in the top view. In the embodiment, the length is defined along an elongated direction of the LED filament 100 in a plane view (e.g., a top view, a front view, or a top view). For example, the second portion 100p2 elongates in the second quadrant in the top view shown in FIG. 4E to form a reversed "L" shape with two ends respectively contacting the X-axis and the Y-axis, and the length of the second portion 100p2 is defined along the reversed "L" shape.

In addition, a length of the third portion 100p3 of the LED filament 100 in the third quadrant in the top view is substantially equal to a length of fourth portion 100p4 of the LED filament 100 in the fourth quadrant in the top view. Since the third portion 100p3 and the fourth portion 100p4 are symmetric with respect to the Y-axis with a tolerance in structure, there may be a slightly difference between the length of the third portion 100p3 and the length of fourth portion 100p4. The difference may be 20%-50% or less.

As shown in FIG. 4E, an emitting direction of a designated point of the first portion 100p1 and an emitting direction of a symmetric point of the second portion 100p2 symmetric to the designated point are symmetric in direction in the top view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100p1 has an emitting direction ED towards right in FIG. 4E, and the symmetric point (x2, y2) of the second portion 100p2 has an emitting direction ED towards left in FIG. 4E. The emitting direction ED of the designated point (x1, y1) and the emitting direction ED of the symmetric point (x2, y2) are symmetric with respect to the Y-axis. In addition, the designated point (x3, y3) of the third portion 100p3 has an emitting direction ED towards a lower-left direction in FIG. 4E, and the symmetric point (x4, y4) of the fourth portion 100p4 has an emitting direction ED towards a lower-right direction in FIG. 4E. The emitting direction ED of the designated point (x3, y3) and the emitting direction ED of the symmetric point (x4, y4) are symmetric with respect to the Y-axis. In addition, an emitting direction ED of any designated point of the first portion 100p1 and an emitting direction ED of a corresponding symmetric point of the second portion 100p2 symmetric to the designated point are symmetric in direction in the top view with respect to the Y-axis. An emitting direction ED of any designated point of the third portion 100p3 and an emitting direction ED of a corresponding symmetric point of the fourth portion 100p4 symmetric to the designated point are symmetric in direction in the top view with respect to the Y-axis.

Definition of the omni-directional light depends on regions and varies over time. Depending on different institutions and countries, LED light bulbs which claim omni-directional light may need to meet different standards. For example, page 24 of the ENERGY STAR Program Requirements for Lamps (bulbs)—Eligibility Criteria Version 1.0 defines that an omnidirectional lamp in base-on position has to emit at least 5% of total flux (lm) in 135° to 180° zone, that 90% of measured intensity values may vary by no more than 25% from the average of all measured values in all planes, and that luminous intensity (cd) is measured within each vertical plane at a 5° vertical angle increment (maximum) from 0° to 135°. Japanese JEL 801 requires luminous flux of an LED lamp within a 120 degrees zone about a light axis shall not be less than 70% of total flux. Because the above embodiment possesses a symmetrical arrangement of LED filament, an LED light bulb with the LED filament is able to meet various standards of omni-directional lamps.

Figure 5A:
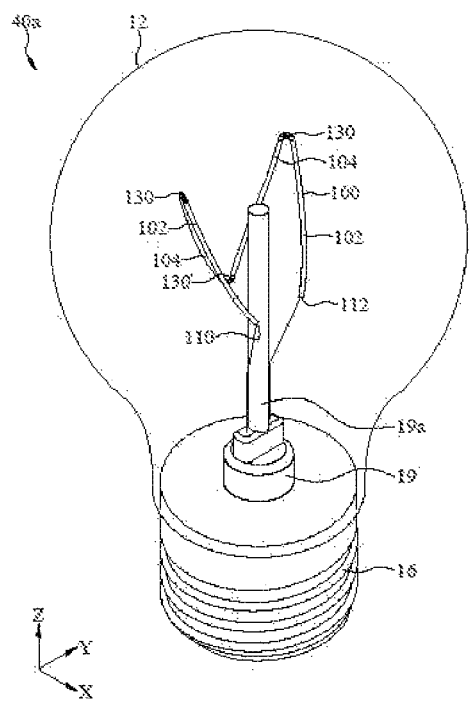
FIGS. 5A to 5D are respectively a perspective view, a side view, another side view and a top view of an LED light bulb in accordance with an embodiment of the present invention.
Figure 5B:
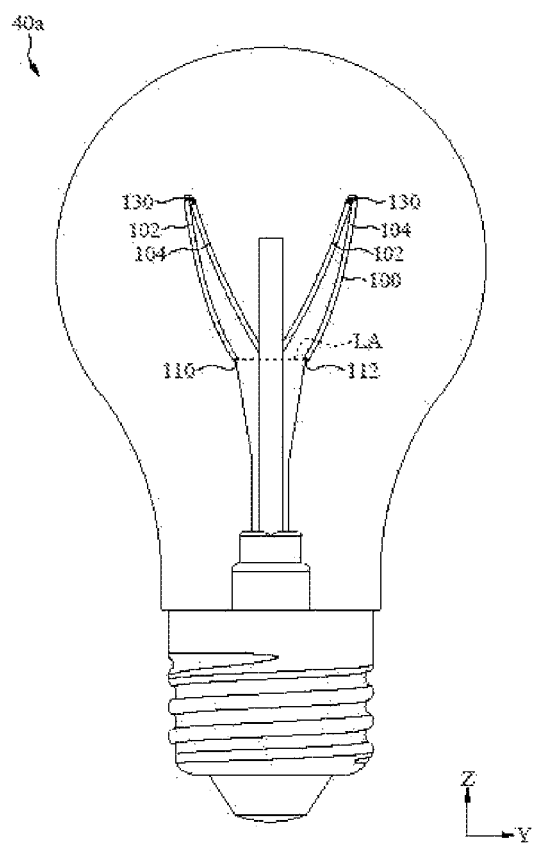
Figure 5C:
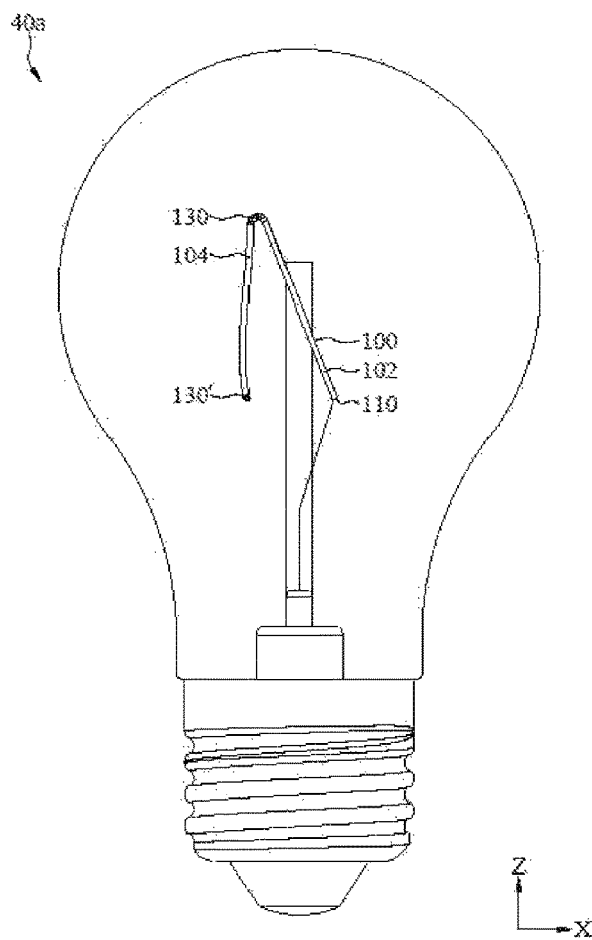
Figure 5D:
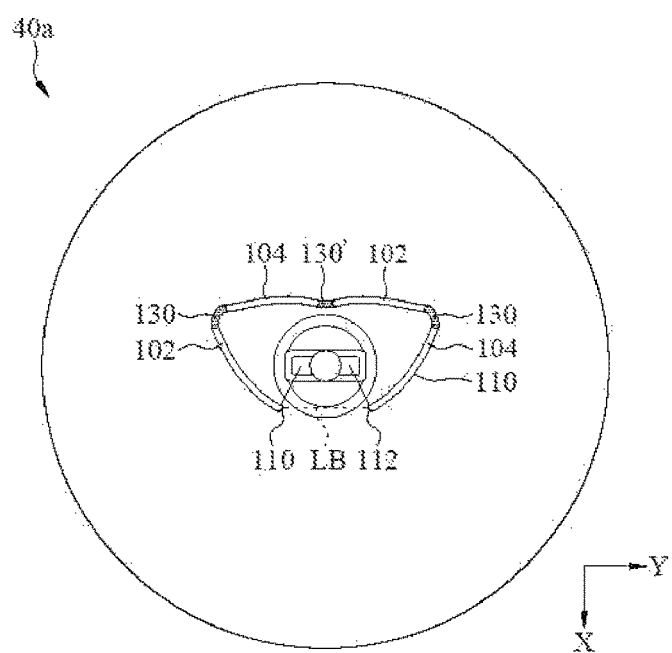

Referring to FIGS. 5A, 5B, 5C and FIG. 5D, FIG. 5A illustrates a schematic diagram of an LED light bulb 40a according to an embodiment of the present invention, FIG. 5B to FIG. 5D are a side view, another side view and the top view of the LED light bulb, respectively. In the present embodiment, the LED light bulb 40a includes a lamp housing 12, a bulb base 16 connected to the lamp housing 12, a stem 19, and a single LED filament 100. Moreover, the LED light bulb 40a and the single LED filament 100 disposed in the LED light bulb 40a can refer to related descriptions of the previous embodiments, wherein the same or similar components and the connection relationship between components is no longer detailed.

In the present embodiment, the stem 19 is connected to the bulb base 16 and located in the lamp housing 12, the stem 19 has a stand 19a extending vertically to the center of the lamp housing 12, the stand 19a is located on the central axis of the bulb base 16, or is located on the central axis of the LED light bulb 40a. The LED filament 100 is disposed around the stand 19a and is located within the lamp housing 12, and the LED filament 100 can be coupled to the stand 19a through a cantilever to maintain a predetermined curve and shape. Wherein a detailed description of the cantilever can be referenced to the previous embodiment and the drawings. The LED filament 100 includes two conductive electrodes 110, 112 at both ends, a plurality of LED sections 102, 104 and a plurality of conductive sections 130. As shown in FIG. 5A to FIG. 5D, in order to separate the conductive section 130 and the LED sections 102, 104 in the drawing, the plurality of the conductive sections 130 of the LED filament 100 is illustrated as points or small segments, which is only for the illustrations. It is easier to understand, and not for any limitation, and the subsequent embodiments are similarly to the related drawings by the point or small segment distribution of the conductive section 130 to distinguish from the LED sections 102, 104. As described in various previous embodiments, each of the LED sections 102, 104 can include a plurality of LED chips connected to each other, and each of the conductive sections 130 can include a conductor. Each conductive section 130 is located between adjacent two LED sections 102, 104. The conductors in each conductive section 130 connect the LED chips in the adjacent two LED sections 102, 104, and the LED chips in the two LED sections 102 adjacent to the two conductive electrodes 110, 112 are respectively connected to the two conductive electrodes 110, 112. The stem 19 can be connected to the two conductive electrodes 110, 112 by means of conductive brackets, details of the conductive brackets can be referred to the previous embodiment and the drawings.

As shown in FIG. 5A to FIG. 5D, the LED filament 100 comprises two first conductive sections 130, one second conductive sections 130', and four LED sections 102, 104, and every two adjacent LED sections 102, 104 are connected through the bending first and second conductive section 130, 130'. Moreover, since the first and second conductive sections 130, 130' have better bendability than that of the LED sections 102, 104, the first and second conductive sections 130, 130' between the two adjacent LED sections 102, 104 can be bent severely, so that the angle between the two adjacent LED sections 102, 104 can be smaller, for example, the included angle can reach 45 degrees or less. In the present embodiment, each LED section 102, 104 is slightly curved or not bent compared to the first and second conductive sections 130, 130', so that a single LED filament 100 in the LED light bulb 40a can be bent severer because of the first and second conductive sections 130, 130', and the curling change in bending is more significant. Moreover, the LED filament 100 can be defined as a piece following each bending conductive sections 130, 130', and each LED section 102, 104 is formed into a respective piece.

As shown in FIG. 5B and FIG. 5C, each of the first and second conductive sections 130, 130' and the two adjacent LED sections 102, 104 is composed to form a U-shaped or V-shaped bent structure, that is, the U-shaped or V-shaped bent structure formed by each of the first and second conductive sections 130, 130' and the adjacent two LED sections 102, 104 is bent with two pieces, and the two LED sections 102, 104 are respectively formed the two pieces. In the present embodiment, the LED filament 100 is bent into four pieces by the first and second conductive sections 130, 130', the four LED sections 102, 104 are respectively formed the four pieces. Also, the number of LED sections 102, 104 is one more than the number of the conductive sections 130, 130'.

As shown in FIG. 5B, in the present embodiment, the conductive electrodes 110, 112 are located between the highest point and the lowest point of the LED filament 100 in the Z direction. The highest point is located at the highest first conductive section 130 in the Z direction, and the lowest point is located at the lowest second conductive section 130' in the Z direction. The lower second conductive section 130' and the higher first conductive section 130 are defined with the conductive electrodes 110, 112 as being close to or away from the bulb base 16. Referring to FIG. 5B, in the YZ plane, the positions of the conductive electrodes 110, 112 may constitute a line LA showing with dotted line, there are two first conductive sections 130 above the line LA, and one second conductive sections 130' below the line LA. In other words, in the Z direction, the number of the first conductive sections 130 positioned above the line LA to which the conductive electrodes 110, 112 are connected may be one more than the number of the second conductive section 130' positioned below the line LA. It is also contemplated that relative to the conductive electrodes 110, 112 as a whole, the number of the first conductive sections 130 away from the bulb base 16 is one more than the number of the second conductive section 130' near the bulb base 16. Further, if the LED filament 100 is projected on the YZ plane (refer to FIG. 5B), the line LA connected by the conductive electrodes 110, 112 has at least one intersection with the projection of the LED sections 102, 104. In the YZ plane, the lines LA connected by the conductive electrodes 110, 112 respectively intersect the projections of the two LED sections 104, so that the line LA and the projection of the adjacent two LED sections 104 have two intersections.

As shown in FIG. 5C, if the LED filament 100 is projected on the XZ plane, the projections of the opposing two LED sections 102, 104 overlap each other. In some embodiments, the projections of the opposing two LED sections 102, 104 on a particular plane may be parallel to each other.

As shown in FIG. 5D, if the LED filament 100 is projected on the XY plane, the projections of the conductive electrodes 110, 112 on the XY plane can be connected in a straight line LB showing with dotted line, and the projections of the first and second conductive sections 130,130' on the XY plane are not intersected or overlapped with the line LB, and the projections of the first and second conductive sections 130, 130' on the XY plane are respectively located on one side of the line LB. For example, as showing in FIG. 5D, the projections of the first conductive sections 130 on the XY plane are above the line LB.

As shown in FIGS. 5B to 5D, in the present embodiment, and the projection lengths of the LED filament 100 on the projection planes perpendicular to each other can have a designed proportion, so that the illumination is more uniform. For example, the projection of the LED filament 100 on the first projection surface, such as the XY plane, has a length L1, the projection of the LED filament 100 on the second projection surface, such as the YZ plane, has a length L2, and the projection of the LED filament 100 on the third projection planes, such as the XZ plane, has a length L3. The first projection plane, the second projection plane and the third projection plane are perpendicular to each other, and the normal line of the first projection plane is parallel to the axis of the LED light bulb 40a from the center of the lamp housing 12 to the center of the bulb base 16. Further, the projection of the LED filament 100 on the XY plane as shown in FIG. 5D, and the projection thereof will be similar to an inverted and deformed U shape, and the total length of the projection of the LED filament 100 on the XY plane is the length L1. The projection of the LED filament 100 on the YZ plane as shown in FIG. 5B, the projection thereof will be similar to the inverted and deformed W shape, and the total length of the projection of the LED filament 100 on the YZ plane is the length L2. The projection of the LED filament 100 on the XZ plane can be as shown in FIG. 5C, the projection of which will be similar to an inverted V shape, and the total length of the projection of the LED filament 100 on the XZ plane is the length L3. In the present embodiment, the length L1, the length L2, and the length L3 are approximately in a ratio of 1:1:0.9. In some embodiments, the length L1, the length L2, and the length L3 are approximately in a ratio of 1:(0.5 to 1):(0.6 to 0.9). For example, if the ratio of the length L1, the length L2, and the length L3 is closer to 1:1:1, the illumination uniformity of the single LED filament 100 in the LED light bulb 40a is better, and the omni-directional light appearance is better.

In some embodiments, the projected length of the LED filament 100 in the XZ plane or in the YZ plane is, for example but not limited thereto, a minimum of the height difference between the first conductive section 130 and the second conductive section 130' in the Z direction multiply by the number of LED sections 102, 104, or a minimum of the height difference of the LED filament 100 in the Z direction multiply by the number of LED sections 102, 104. In the present embodiment, the total length of the LED filament 100 is about 7 to 9 times the total length of the first conductive section 130 or the second conductive section 130'.

In the present embodiment, the LED filament 100 can be bent at the positions of the first and second conductive sections 130, 130' to form various curves, so that not only the overall aesthetic appearance of the LED light bulb 40a can be increased but also the light emitting of the LED light bulb 40a can be more uniform, and the better illumination is achieved.

Figure 6A:
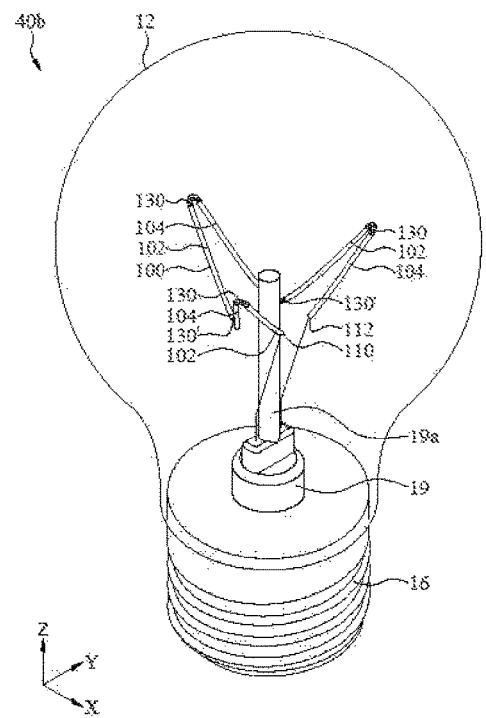
FIGS. 6A to 6D are respectively a perspective view, a side view, another side view and a top view of an LED light bulb in accordance with an embodiment of the present invention.
Figure 6B:
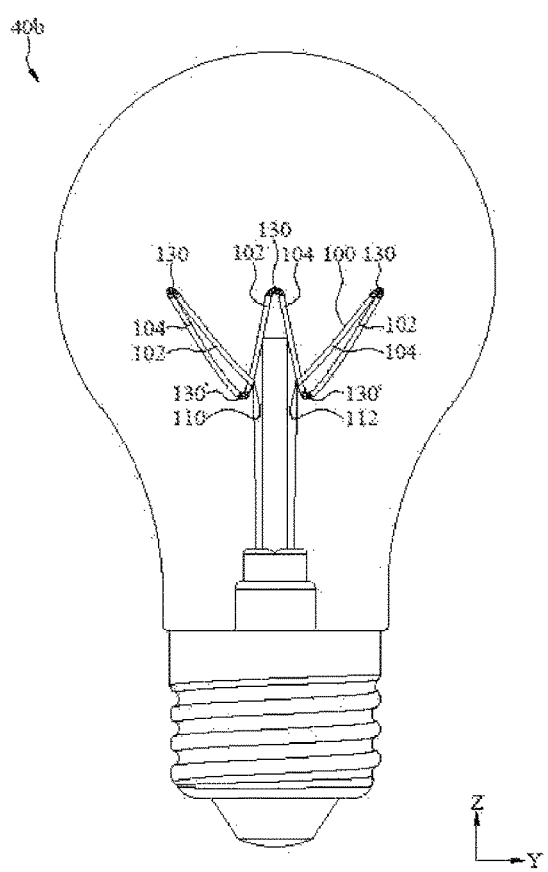
Figure 6C:
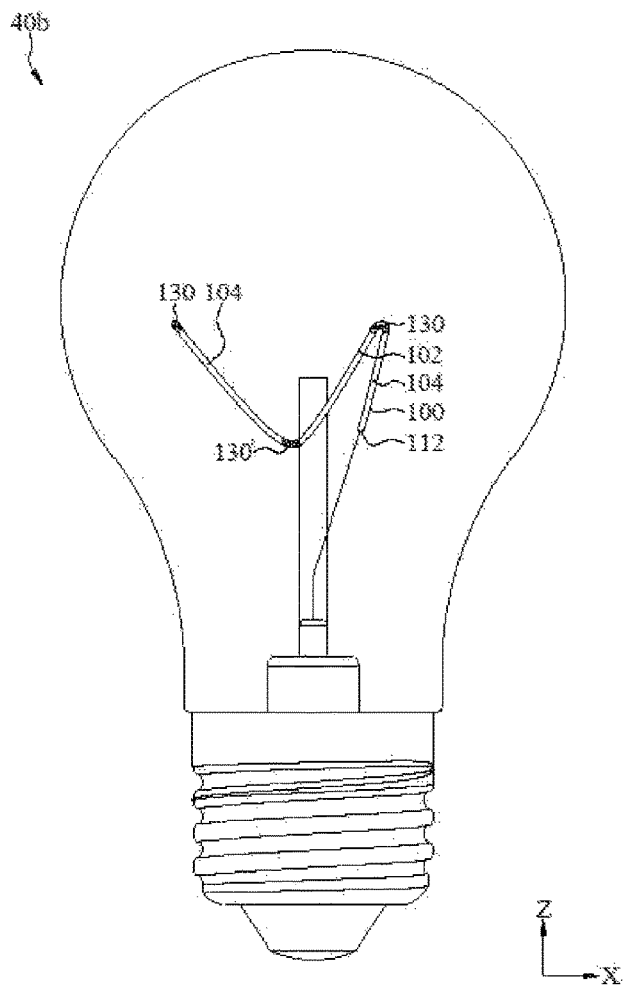
Figure 6D:
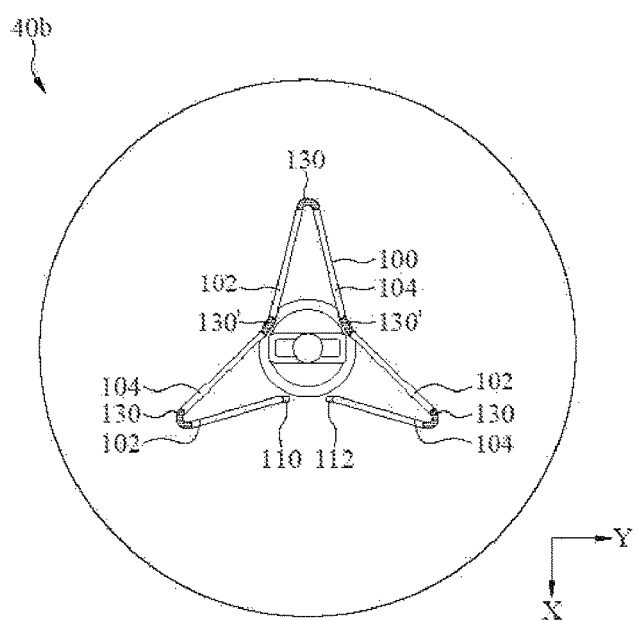

Referring to FIGS. 6A to 6D, FIG. 6A is a perspective diagram of an LED light bulb 40b according to an embodiment of the present invention, and FIGS. 6B to 6D are respectively side views, another side view, and top view of the FIG. 6A. In the present embodiment, the LED light bulb 40b includes a lamp housing 12, a bulb base 16 connected to the lamp housing 12, a stem 19, a stand 19a, and a single LED filament 100. The LED filament 100 includes two conductive electrodes 110, 112 disposed at two ends, a plurality of LED sections 102, 104 and a plurality of the first and second conductive sections 130, 130'. Moreover, the LED light bulb 40b and the LED filament 100 disposed in the LED light bulb 40b may refer to related descriptions of the previous embodiments, wherein the same or similar components and the connection relationship between components is no longer detailed.

As shown in FIG. 6A to FIG. 6D, the LED filament 100 comprises three first conductive sections 130, two second conductive sections 130' of, and six LED sections 102, 104, and every two adjacent LED sections 102, 104 are connected through the bending first or second conductive sections 130, 130'. Therefore, a single LED filament 100 in the LED light bulb 40b can be bent severer because of the first and second conductive sections 130, 130', and the curling modification in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into six sections by the three first conductive sections 130 and the two second conductive sections 130', wherein the six LED sections 102, 104 are respectively the six pieces.

Referring to FIG. 6A and FIG. 6B, in the present embodiment, the height of the upper three first conductive sections 130 may be greater than the height of the other lower two second conductive sections 130' in the Z direction. The height of the four LED sections 102, 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the first conductive section 130 in the Z direction. As shown in FIG. 6C of the present embodiment, the projections of the opposite LED sections 102, 104 are overlapped each other when the LED filament 100 is projected on the XZ plane. In the embodiment as shown in FIG. 6D, when the LED filament 100 is projected on the XY plane, the projections of all the second conductive sections 130' are located in one side of a straight line connecting between the conductive electrodes 110, 112, and the projections of the first conductive section 130 is dispersed on both sides of the straight line connecting between the conductive electrodes 110, 112.

Figure 7A:
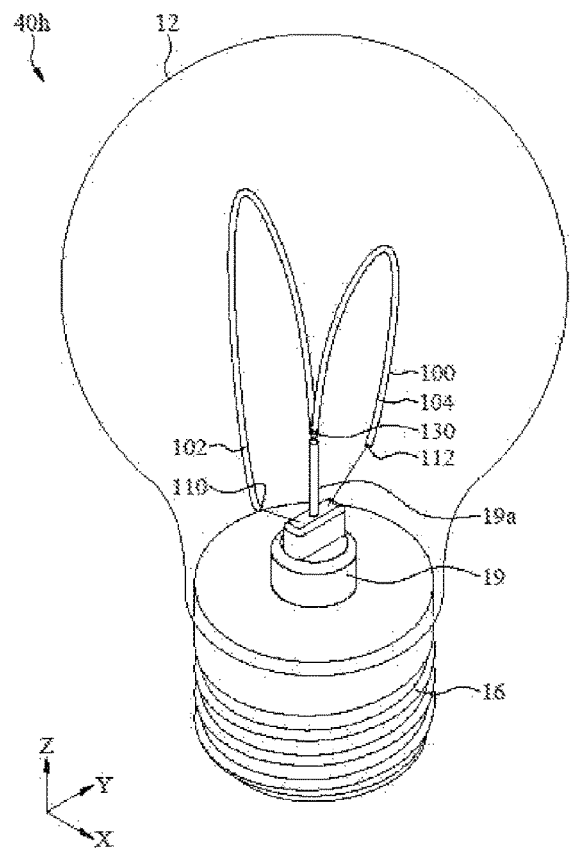
FIGS. 7A to 7D are respectively a perspective view, a side view, another side view and a top view of an LED light bulb in accordance with an embodiment of the present invention.
Figure 7B:
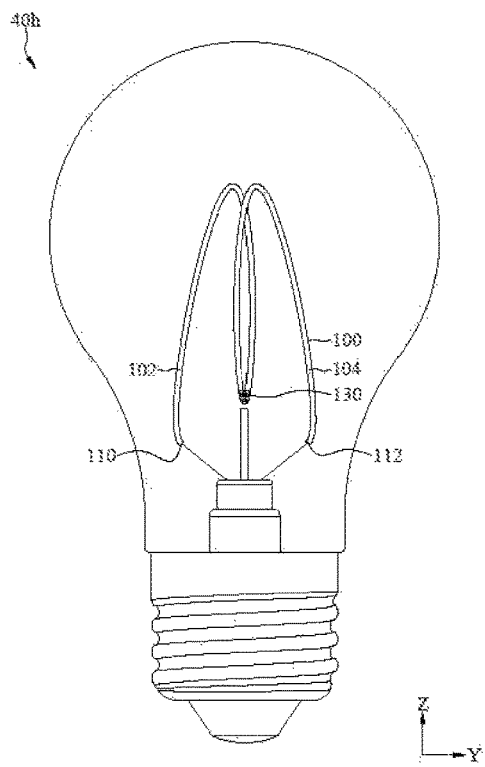
Figure 7C:
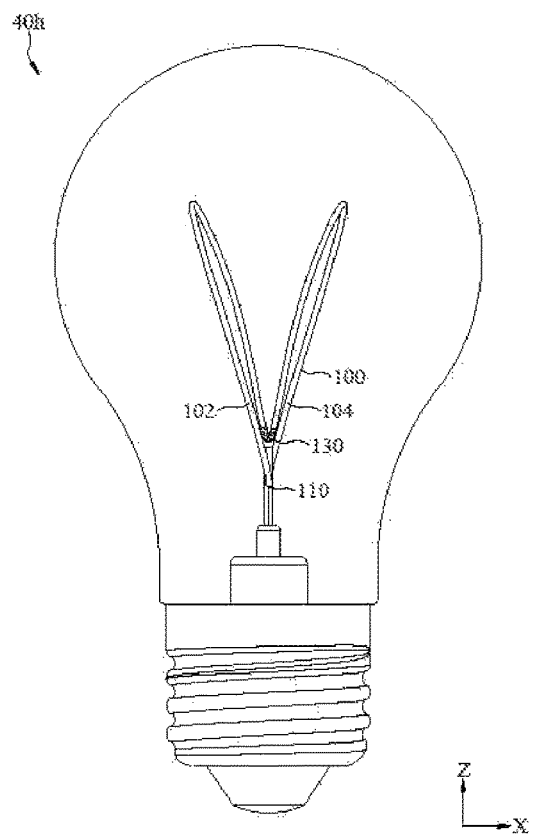
Figure 7D:
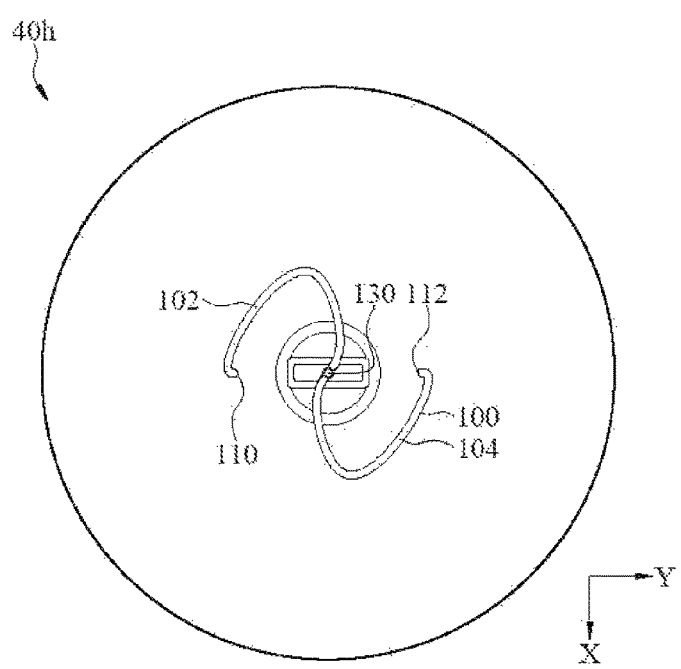

Referring to FIGS. 7A to 7D, FIG. 7A is a perspective diagram of an LED light bulb 40h according to an embodiment of the present invention, and FIGS. 7B to 7D are respectively side view, another side view, and top view of the FIG. 7A. In the present embodiment, the LED light bulb 40h includes a lamp housing 12, a bulb base 16 connected to the lamp housing 12, a stem 19, a stand 19a, and a single LED filament 100. The LED filament 100 includes two conductive electrodes 110, 112 at two ends, a plurality of LED sections 102, 104 and a single conductive section 130. Moreover, the LED light bulb 40h and the single LED filament 100 disposed in the LED light bulb 40h can refer to related descriptions of the previous embodiments, wherein the same or similar components and the connection relationship between components is no longer detailed.

Referring to FIGS. 7A to 7D, in the present invention, the LED filament section 100 includes one conductive section 130, two LED sections 102, 104, and between two adjacent LED sections 102, 104 is connected by the conductive section 130. Wherein the LED filament 100 having a circular arc at the highest point of the bending curvature, that is, each of the LED sections 102, 104 respectively having a circular arc at the highest point of the LED filament 100, and the conductive section also exhibits a circular arc at the low point of the LED filament. Moreover, the LED filament 100 can be defined as having a plurality of sections, each of the sections is connected between the first and second conductive sections 130, and each LED section 102, 104 is formed into a respective section.

Moreover, since the LED filament 100 is equipped with a flexible base layer, the flexible base layer preferably is made by an organosilicon-modified polyimide resin composition, and thus the LED sections 102, 104 themselves also have a certain degree of bendability. In the present embodiment, the two LED sections 102, 104 are respectively bent to form in the shape like an inverted deformed U letter, and the conductive section 130 is located between the two LED sections 102, 104, and the degree of the bending of the conductive section 130 is the same as or greater than the degree of the bending of the LED sections 102, 104. In other words, the two LED sections 102, 104 of the LED filament are respectively bent at the high point to form in the shape like an inverted deformed U letter and have a bending radius value at R1, and the conductive section 130 is bent at a low point of the LED filament 100 and has a bending radius value at R2, wherein the value R1 is the same as or greater than the value R2. Through the configuration of the conductive section 130, the LED filament 100 disposing in a limited space can be realized with a small radius bending of the LED filament 100. In one embodiment, the bending points of the LED sections 102, 104 are at the same height in the Z direction. Further, in the Z direction, the stand 19a of the present embodiment has a lower position than the stand 19a of the previous embodiment, and the height of the present stand 19a is corresponding to the height of the conductive section 130. For example, the lowest portion of the conductive section 130 can be connected to the top of the stand 19a so that the overall shape of the LED filament 100 is not easily deformed. In various embodiments, the conductive sections 130 may be connected to the stand 19a through the perforation of the top of the stand 19a, or the conductive sections 130 may be glued to the top of the stand 19a to connect with each other, but are not limited thereto. In an embodiment, the conductive section 130 and the stand 19a may be connected by a guide wire, for example, a guide wire connected to the conductive section 130 is drawn at the top of the stand 19a.

As shown in FIG. 7B, in the present embodiment, the height of the conductive section 130 is higher than the two conductive electrodes 110, 112 in the Z direction, and the two LED sections 102, 104 are respectively shaped upward from the two conductive electrodes 110, 112 to the highest point and then are bent down to connect with the conductive section 130. As shown in FIG. 7C, in the present embodiment, the contour of the LED filament 100 in the XZ plane is similar to the V letter, that is, the two LED sections 102, 104 are respectively shaped obliquely upward and outward and are bent respectively at the highest point and then obliquely inwardly to connect with the conductive section 130. As shown in FIG. 7D, in the present embodiment, the LED filament 100 has a contour in the shape like S letter in the XY plane. As shown in FIG. 7B and FIG. 7D, in the present embodiment, the conductive section 130 is located between the conductive electrodes 110, 112. As shown in FIG. 7D, in the XY plane, the main bending points of the LED sections 102, 104, and the conductive electrodes 110, 112 are substantially on the circumference centered on the conductive section 130.

Figure 8:
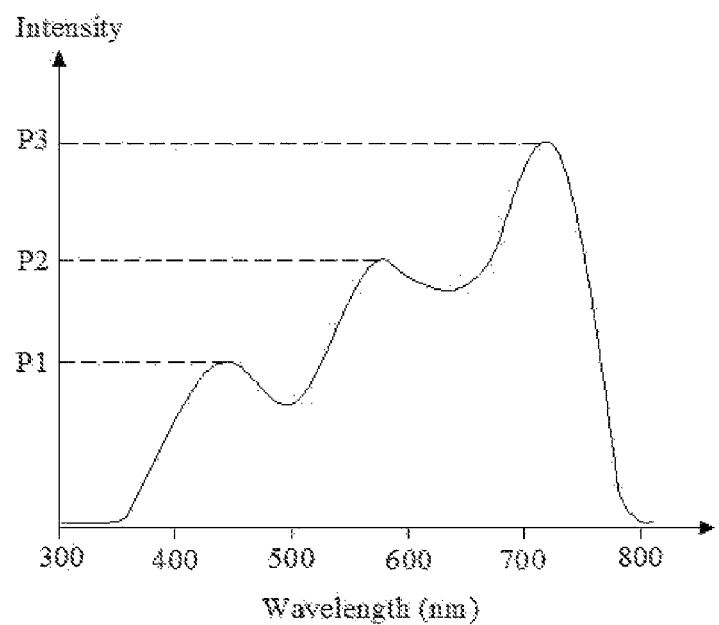
FIG. 8 is a schematic view showing the light emission spectrum of an LED light bulb in accordance with an embodiment of the present invention.
Figure 9:
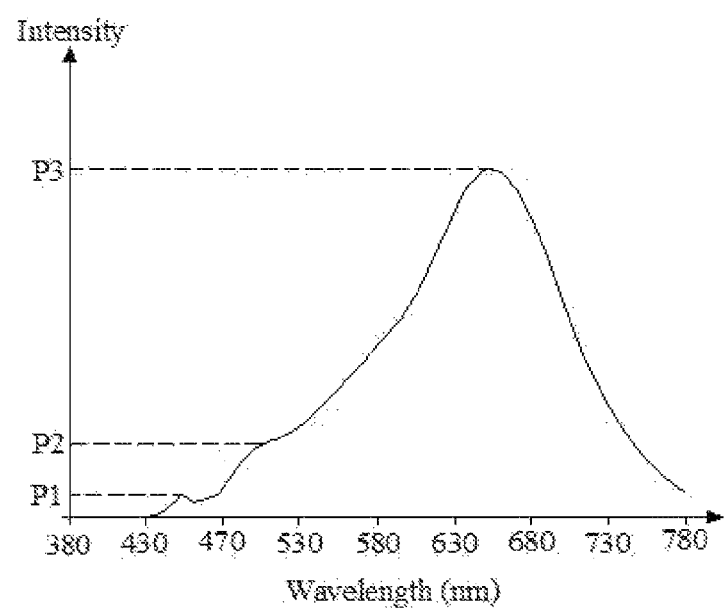
FIG. 9 is a schematic view showing the light emission spectrum of an LED light bulb in accordance with another embodiment of the present invention.

Referring to FIG. 8, which is a schematic diagram of the light emission spectrum of an LED light bulb according to an embodiment of the present invention. In the present embodiment, the LED light bulb may be any of the LED light bulbs disclosed in the previous embodiments, and any one of the LED light bulbs disclosed in the previous embodiments is provided. The light emitted by the LED light bulb is measured by a spectrometer to obtain a spectrum diagram as shown in FIG. 8. From the spectrum diagram, the spectral distribution of the LED light bulb is mainly between the wavelength ranges of about 400 nm to 800 nm. Moreover, there are three peaks of intensity values P1, P2, P3 in wavelength ranges corresponding to the light emitted by the LED light bulb. The wavelength of the intensity value P1 is between about 430 nm and 480 nm, the wavelength of the intensity value P2 is between about 580 nm and 620 nm, and the wavelength of the intensity value P3 is between about 680 nm and 750 nm. The light intensity of the peak P1 is less than that of the peak P2, and the light intensity of the peak P2 is less than the light intensity of the peak P3. As shown in FIG. 8, such a spectral distribution is close to the spectral distribution of a conventional incandescent filament lamp and also close to the spectral distribution of natural light. In accordance with an embodiment of the present invention, a schematic diagram of the light emission spectrum of a single LED filament is shown in FIG. 9. From the spectrum diagram, it can be seen that the spectral distribution of the LED light bulb is mainly between the wavelength range of about 400 nm to 800 nm, and there are three peaks of intensity values P1, P2, P3 in that wavelength range. The wavelength of the intensity value P1 is between about 430 nm and 480 nm, the wavelength of the intensity value P2 is between about 480 nm and 530 nm, and the wavelength of the intensity value peak P3 is between about 630 nm and 680 nm. Such a spectral distribution is close to the spectral distribution of a conventional incandescent filament lamp and also close to the spectral distribution of natural light.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 10A:
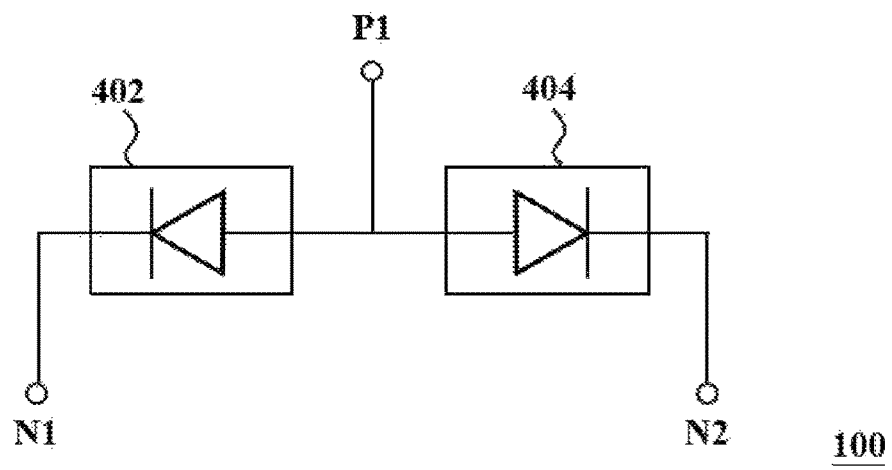
FIGS. 10A to 10C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.g., conductive supports 51a, 51b in FIG. 3A) and finally connect to a power module (such as power module 518 in FIG. 3A). As shown in FIG. 10A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51a, 51b and power module 518 shown in FIG. 3A.

Figure 10B:
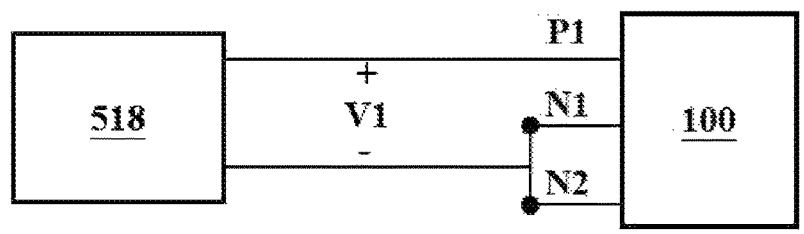
Figure 10C:
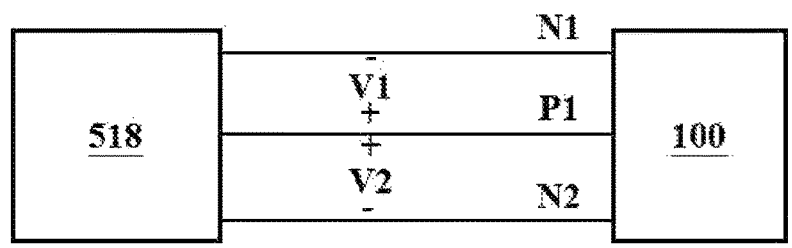

In more detail, the connection relationship between positive electrode P1, first negative electrode N1 and second negative electrode N2 may be shown as FIG. 10B or FIG. 10C, in which FIGS. 10B and 10C are two schematic views of electrical connections of the LED filament according to some embodiments of the present invention. Please refer to FIG. 10B first. In this embodiment, positive electrode P1 of LED filament 100 is electrically electrically connected to a first output terminal (also called "positive output terminal) of power module 518. First and second negative electrodes N1, N2 of LED filament 100 are electrically electrically connected together and then jointly electrically connected to a second output terminal (also called "negative output terminal") of power module 518. Further refer to FIG. 10A, under the electrical relationship shown in FIG. 10B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 10C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and he second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 10A together, under the electrical relationship shown in FIG. 10C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 10C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 11A:
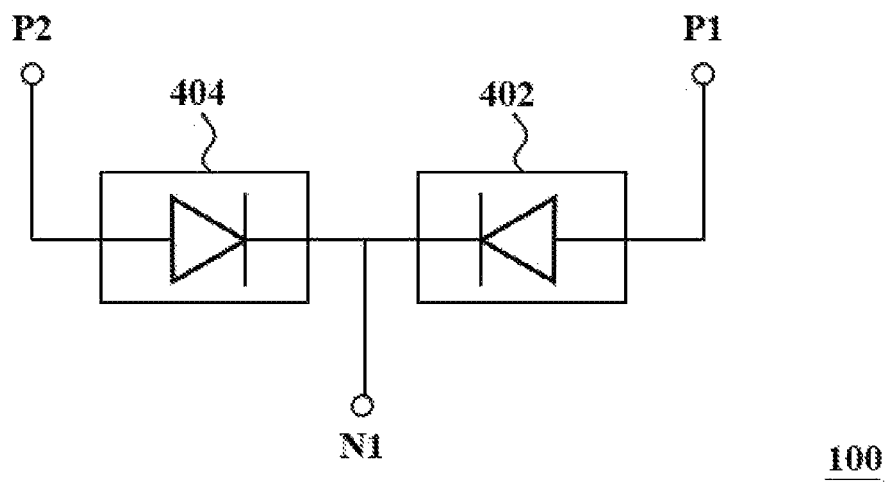
FIGS. 11A to 11C are schematic circuit diagrams of an LED filament in accordance with another embodiment of the present invention.

FIG. 11A is a schematic circuit diagram of the LED filament according to some embodiments of the present invention. In this embodiment, LED filament 100, which is similar to the one shown in FIG. 10A, has two LED sections 402, 404, and thus the details of the LED sections 402, 404 will not be repeated herein. A main difference between this embodiment and the embodiment shown in FIG. 10A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51a, 51b and power module 518 shown in FIG. 3A.

Figure 11B:
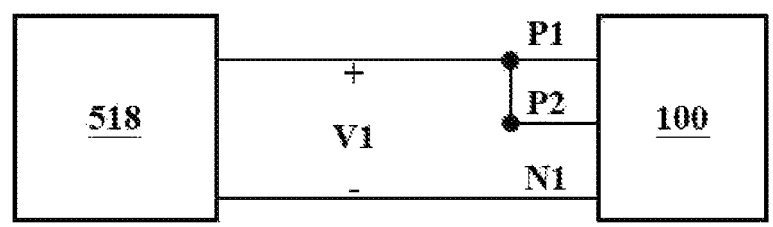
Figure 11C:
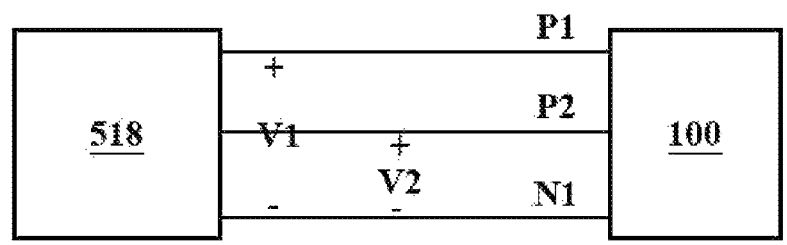

The electrical relationship between negative electrode N1, first positive electrode P1 and second positive electrode P2 of LED filament 100 and the power module may be shown in FIG. 11B or 11C. FIGS. 11B and 11C are two schematic views of electrical connections of the LED filament according to two different embodiments. Please refer to FIG. 11B first. In this embodiment, a first positive electrode P1 and a second positive electrode P2 of LED filament 100 are electrically electrically connected together and jointly electrically connected to a first output terminal (also called "positive output terminal) of power module 518. Negative electrode N1 of LED filament 100 is electrically electrically connected to a second output terminal (also called "negative output terminal") of power module 518. Further refer to FIG. 11A, under the electrical relationship shown in FIG. 11B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 10B.

Please further refer to FIG. 11C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 11A. Under the electrical relationship shown in FIG. 11C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 11C, a dimming function can be implemented to a single LED filament by design and control of the power module.

Figure 12A:
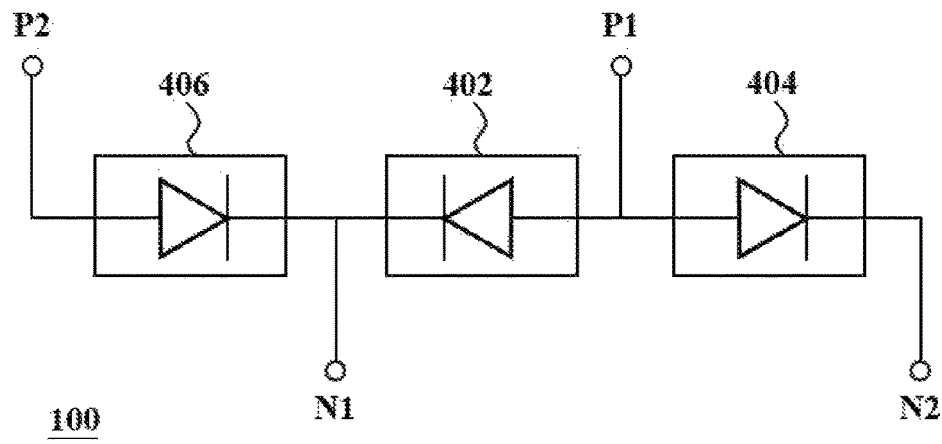
FIGS. 12A to 12D are schematic circuit diagrams of an LED filament in accordance with another embodiment of the present invention.

FIG. 12A is a schematic circuit diagram of the LED filament according to some embodiments of the present invention. In this embodiment, LED filament 100 has three LED sections 402, 404, 406 as shown in FIG. 12A. In detail, LED filament 100 of this embodiment is based on FIG. 10A and adds LED section 406 (also deemed as being based on FIG. 11A and adding LED section 404 in FIG. 12A, wherein LED section 406 in FIG. 12A corresponds to LED section 404 in FIG. 11A). The arrangement of LED sections 402, 404 can refer to the above embodiments, it will not be repeated here. In this embodiment, the arrangement of LED section 406, which is identical or similar to that of LED section 402 or 404, includes one or more LED chips. The LED chips are electrically connected in series. Three LED sections 402, 404, 406 have respective current paths after they have been electrically electrically connected (i.e. in parallel). In detail, in this embodiment, cathodes of LED sections 406 and 402 are electrically connected together (i.e. cathodes of LED sections 402, 406 jointly serve as a first negative electrode N1). And anode of LED section 406 serves as a second positive electrode P2 of LED filament 100. In other words, In this embodiment, LED filament 100 further includes second positive electrode P2 formed by connecting to the anode of LED section 406 other than first positive electrode P1, first negative electrode N1 and second negative electrode N2.

Figure 12B:
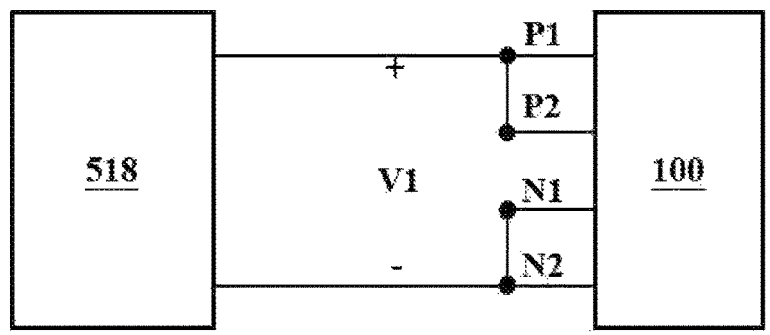
Figure 12C:
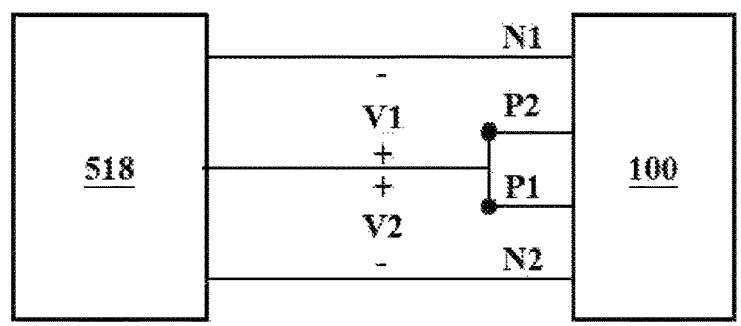
Figure 12D:
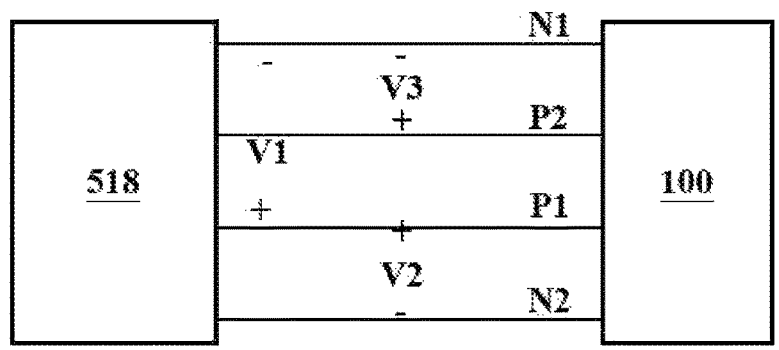

In this embodiment, under the arrangement of LED filament 100, the electrical relationship between LED filament 100 and the power module may be shown in FIGS. 12B to 12D to implement the current sharing drive control or sectional independent control. FIGS. 11B and 11C are two schematic views of electrical connections of two embodiments of the LED filament. Please refer to FIG. 11B first. In this embodiment, a first positive electrode P1 and a second positive electrode P2 of LED filament 100 are electrically electrically connected together and jointly electrically connected to a first output terminal (also called "positive output terminal) of power module 518. First negative electrode N1 and second negative electrode N2 of LED filament 100 are electrically electrically connected together and electrically connected to a second output terminal (also called "negative output terminal") of power module 518. Further refer to FIG. 12A, under the electrical relationship shown in FIG. 12B, LED sections 402, 404, 406 can be deemed as being electrically connected to the output terminals of power module 518 in parallel. Thus, all LED sections 402, 404, 406 are driven by driving voltage V1 between the first and second output terminals. Under a precondition of LED sections 402, 404, 406 having identical or similar chips number and arrangement, the driving current from power module 518 will evenly dividedly flow to each of LED sections 402, 404, 406. As a result, LED sections 402, 404, 406 can present approximately even intensity and/or color temperature. This arrangement is equivalent to that of the embodiment shown in FIGS. 10B and 10B.

Please further refer to FIG. 12C. In this embodiment, first positive electrode P1 and second positive electrode P2 of LED filament 100 are electrically connected together and jointly electrically connected to the first output terminal (also called "first positive output terminal") of power module 518, first negative electrode N1 of LED filament 100 is electrically connected to the second output terminal (also called "first negative output terminal") of power module 518, and second negative electrode N2 of LED filament 100 is electrically connected to the third output terminal (also called "second negative output terminal") of power module 518. Under such an arrangement, both first positive electrode P1 and second positive electrode P2 can be deemed as the same terminal. Thus, the whole circuit is equivalent to FIG. 10C. Related control manner, functions and effects can refer to the description of FIG. 10C. The arrangement of this embodiment can make a single filament have a two-stage dimming effect.

Please further refer to FIG. 12D. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to fourth output terminal (also called "second negative output terminal") of power module 518. Further refer to FIG. 12A, under such an arrangement shown in FIG. 12D, LED section 402 is electrically connected between the first and third terminals, LED section 404 is electrically connected between the first and fourth output terminals, and LED section 406 is electrically connected between the second and third terminals. Thus, LED sections 402, 404, 406 can be deemed as being driven by driving voltages V1, V2, V3, respectively. In such an arrangement, the driving currents provided by power module 518 to LED sections 402, 404, 406 can be independently controlled by adjusting output voltages V2, V2, V3 so as to make LED sections 402, 404, 406 separately generate corresponding intensity and/or color temperature. The arrangement of this embodiment can make a single filament have a three-stage dimming effect.

Figure 13A:
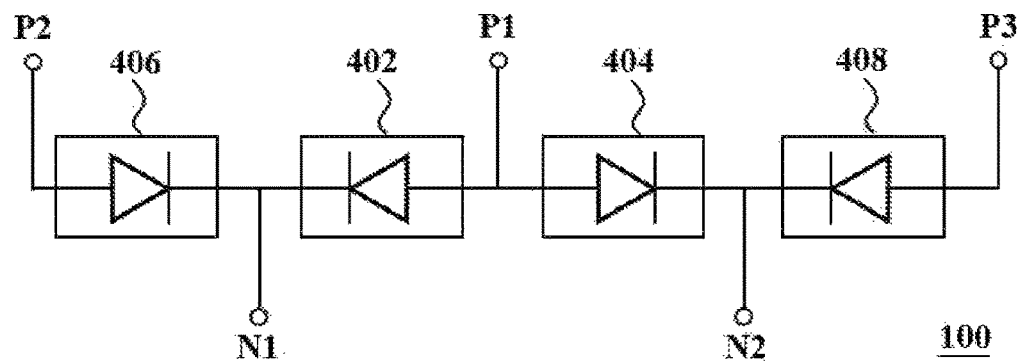
FIGS. 13A to 13E are schematic circuit diagrams of an LED filament in accordance with another embodiment of the present invention.
Figure 13B:
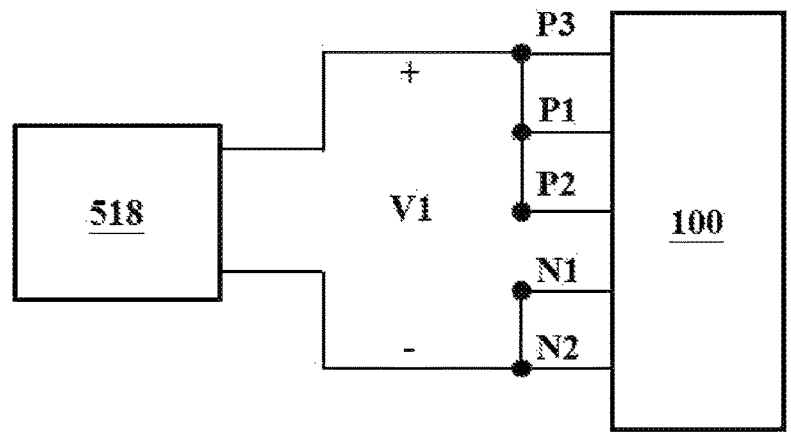

FIG. 13A is a schematic circuit diagram of an embodiment of the LED filament of the present invention. In this embodiment, LED filament 100 has four LED sections 402, 404, 406, 408 as shown in FIG. 13A. In detail, LED filament 100 of this embodiment is based on FIG. 12A and further includes LED section 408. The arrangement of LED sections 402, 404, 406 can refer to the above embodiments, it will not be repeated here. In this embodiment, the arrangement of LED section 408, which is identical or similar to that of LED section 402, 404 or 406, includes one or more LED chips. The LED chips are electrically connected in series. Three LED sections 402, 404, 406, 408 have respective current paths after they have been electrically electrically connected (i.e. in parallel). In detail, cathodes of LED sections 408 and 404 are electrically connected together (i.e. cathodes of LED sections 402, 406 jointly serve as a second negative electrode N2). And anode of LED section 408 serves as a third positive electrode P3 of LED filament 100. In other words, In this embodiment, LED filament 100 further includes third positive electrode P3 formed by connecting to the anode of LED section 408 other than first positive electrode P1, second positive electrode P2, first negative electrode N1 and second negative electrode N2.

In this embodiment, under the arrangement of LED filament 100, the electrical relationship between LED filament 100 and the power module may be shown in FIGS. 13B to 13E to implement the current sharing drive control or sectional independent control. FIGS. 13B to 13E are four schematic views of electrical connections of four embodiments of the LED filament. Please refer to FIG. 13B first. In this embodiment, a first positive electrode P1, a second positive electrode P2 and a third positive electrode P3 of LED filament 100 are electrically electrically connected together and jointly electrically connected to a first output terminal (also called "positive output terminal) of power module 518. First negative electrode N1 and second negative electrode N2 of LED filament 100 are electrically electrically connected together and electrically connected to a second output terminal (also called "negative output terminal") of power module 518. Further refer to FIG. 13A, under the electrical relationship shown in FIG. 13B, LED sections 402, 404, 406, 408 can be deemed as being electrically connected to the output terminals of power module 518 in parallel. Thus, all LED sections 402, 404, 406, 408 are driven by driving voltage V1 between the first and second output terminals. Under a precondition of LED sections 402, 404, 406, 408 having identical or similar chips number and arrangement, the driving current from power module 518 will evenly dividedly flow to each of LED sections 402, 404, 406, 408. As a result, LED sections 402, 404, 406 can present approximately even intensity and/or color temperature. This arrangement is equivalent to that of the embodiment shown in FIGS. 10B, 11B and 12B.

Figure 13C:
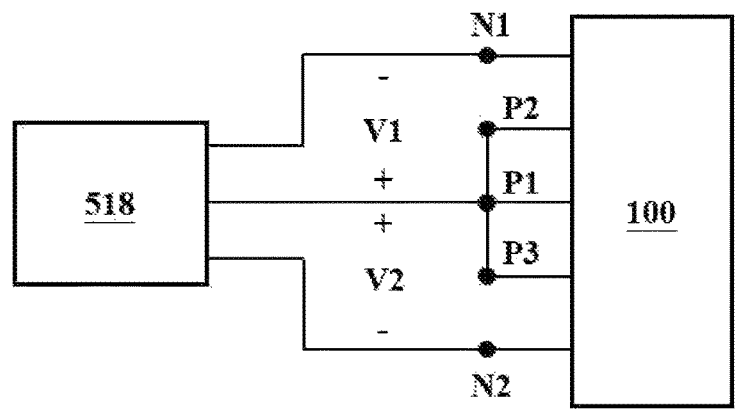

Please further refer to FIG. 13C. In this embodiment, first positive electrode P1, second positive electrode P2 and third positive electrode P3 of LED filament 100 are electrically connected together and jointly electrically connected to the first output terminal (also called "first positive output terminal") of power module 518, first negative electrode N1 of LED filament 100 is electrically connected to second output terminal (also called "first negative output terminal") of power module 518, and second negative electrode N2 of LED filament 100 is electrically connected to the third output terminal (also called "second negative output terminal") of power module 518. Under such an arrangement, first positive electrode P1, second positive electrode P2 and third positive electrode P3 can be deemed as the same terminal. Thus, the whole circuit is equivalent to FIG. 10C. Related control manner, functions and effects can refer to the description of FIG. 10C. The arrangement of this embodiment can make a single filament have a two-stage dimming effect.

Figure 13D:
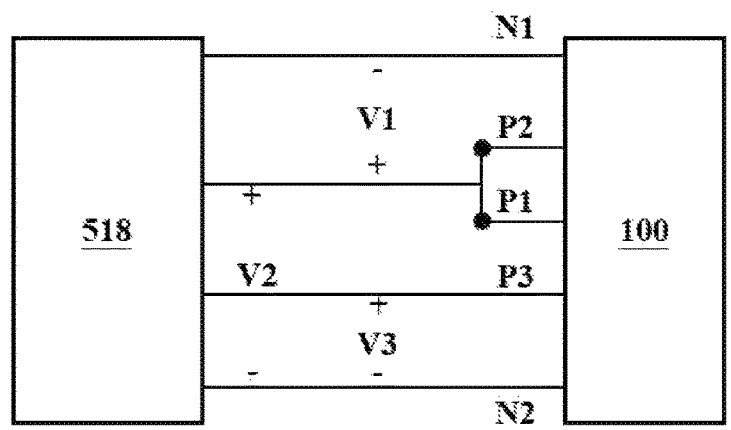

Please further refer to FIG. 13D. In this embodiment, first positive electrode P1 and second positive electrode P2 of LED filament 100 are electrically connected to the first output terminal (also called "first positive output terminal") of power module 518, third positive electrode P3 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to the fourth output terminal (also called "second negative output terminal") of power module 518. Under such an arrangement, first positive electrode P1 and second positive electrode P2 can be deemed as the same terminal. Thus, the whole circuit is equivalent to FIG. 12D. Related control manner, functions and effects can refer to the description of FIG. 12D. The arrangement of this embodiment can make a single filament have a three-stage dimming effect.

Figure 13E:
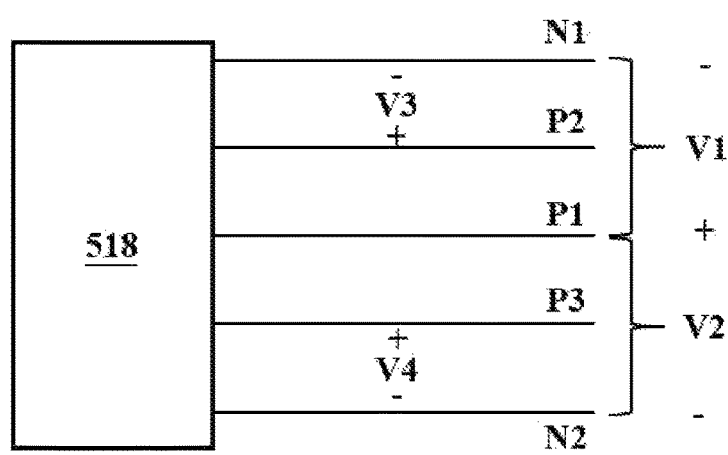

Please further refer to FIG. 13E. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, third positive electrode P3 of LED filament 100 is electrically connected to the third output terminal (also called "third positive output terminal") of power module 518, first negative electrode N1 of LED filament 100 is electrically connected to the fourth output terminal (also called "first negative output terminal"), and second negative electrode N2 is electrically connected to the fifth output terminal (also called "second negative output terminal") of power module 518. Under such an arrangement, a driving voltage V1 is formed between the first output terminal and the fourth output terminal of power module 518, another driving voltage V2 is formed between the first output terminal and the fifth output terminal of power module 518, still another driving voltage V3 is formed between the second output terminal and the fourth output terminal of power module 518, and yet another driving voltage V4 is formed between the third output terminal and the fifth output terminal of power module 518. Further refer to FIG. 13A, under the electrical relationship shown in FIG. 13E, LED section 402 is electrically connected between the first and fourth terminals, LED section 404 is electrically connected between the first and fifth output terminals, LED section 406 is electrically connected between the second and fourth terminals, and LED section 408 is electrically connected between the third and fifth output terminals. Thus, LED sections 402, 404, 406, 408 can be deemed as being driven by driving voltages V1, V2, V3, V4, respectively. In such an arrangement, the driving currents provided by power module 518 to LED sections 402, 404, 406, 408 can be independently controlled by adjusting output voltages V2, V2, V3, V4 so as to make LED sections 402, 404, 406, 408 separately generate corresponding intensity and/or color temperature. The arrangement of this embodiment can make a single filament have a four-stage dimming effect.

In sum, according the abovementioned embodiments, the description has clearly disclosed a strip of filament with multiple dimming control by two, three or four LED sections. According the description, a person having ordinary skill in the art can easily implement a strip of filament with multiple dimming control by five or more LED sections.

Figure 14:
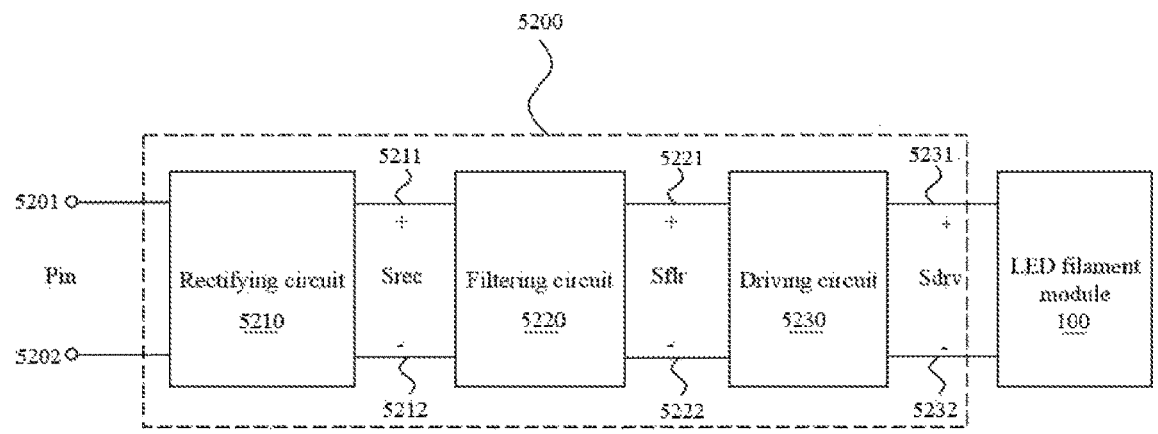
FIG. 14 is a block diagram of a power supply module of an LED light bulb in accordance with an embodiment of the present invention.

Next part of the present disclosure will describe the circuit design of the driving circuit of the filament bulb. From circuit perspective, power module 518 in FIG. 3A may be represented by a circuit block 5200 (below described and referred to as "power module 5200") as shown in FIG. 14. FIG. 14 is a circuit block diagram of a power module of an LED filament bulb according to some embodiments of present invention. Referring to FIG. 14, power module 5200 includes a rectifying circuit 5210, a filtering circuit 5220, and a driving circuit 5230. Rectifying circuit 5210 is coupled to a first pin 5201 and a second pin 5202, also known as external connection terminals, to receive and then rectify an external driving signal Pin, in order to output a rectified signal Srec through a first rectifying output terminal 5211 and a second rectifying output terminal 5212. In different embodiments, external driving signal Pin may be an AC driving signal, an AC power supply signal (such as a power grid signal), or even a DC signal, which choices each typically do not affect operations of the LED filament bulb. When the LED filament bulb is designed to emit light or light up based on a DC signal, rectifying circuit 5210 in power module 5200 may be omitted. In a configuration without rectifying circuit 5210, first rectifying output terminal 5211 and second rectifying output terminal 5212 would be directly coupled to input terminals (as 5211 and 5212) of filtering circuit 5220.

Filtering circuit 5220 is coupled to rectifying circuit 5210 in order to filter rectified signal Srec, that is, input terminals of filtering circuit 5220 are coupled to first rectifying output terminal 5211 and second rectifying output terminal 5212 to receive and then filter rectified signal Srec, in order to output a filtered signal Sflr through a first filtering output terminal 5221 and a second filtering output terminal 5222. First rectifying output terminal 5211 may be regarded as a first filtering input terminal and second rectifying output terminal 5212 may be regarded as a second filtering input terminal, of filtering circuit 5220. In this embodiment, filtering circuit 5220 may filter out ripples in rectified signal Srec, to make the waveform of produced filtered signal Sflr smoother than that of rectified signal Srec. Besides, circuit configuration of filtering circuit 5220 may be set to realize filtering with respect to a certain or specific (band of) frequency, to filter out frequency response or output energy at a certain or specific frequency in response to external driving signal Pin.

Driving circuit 5230 is coupled to filtering circuit 5220, to receive and then perform power conversion to filtered signal Sflr, in order to generate a driving power Sdrv, that is, input terminals of driving circuit 5230 are coupled to first filtering output terminal 5221 and second filtering output terminal 5222 to receive filtered signal Sflr and then generate driving power Sdrv used for driving LED filament module 100 for emitting light. First filtering output terminal 5221 may be regarded as a first driving input terminal and second filtering output terminal 5222 may be regarded as a second driving input terminal, of driving circuit 5230. Driving power Sdrv generated by driving circuit 5230 is then provided to LED filament module 100 through a first driving output terminal and a second driving output terminal, to enable an LED filament (as 100) of LED filament module 100 to light up in response to driving power Sdrv. Some embodiments of rectifying circuit 5210, filtering circuit 5220, and driving circuit 5230 of power module 5200 in possible configurations are presented and described below, but the invention is not limited thereto.

Figure 15A:
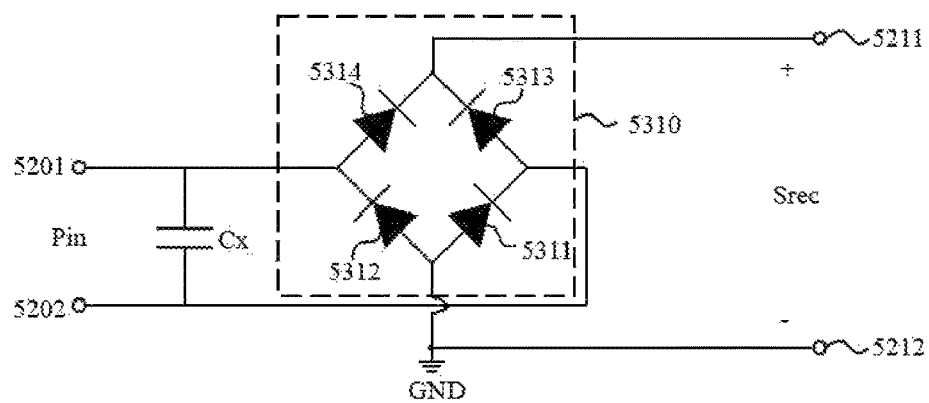
FIG. 15A is a schematic diagram of a rectifying circuit in accordance with an embodiment of the present invention.

FIG. 15A is a circuit diagram of a rectifying circuit according to some embodiments of present invention. Referring to FIG. 15A, rectifying circuit 5310 is a bridge rectifier including diodes 5311-5314 used for performing (full-wave) rectification to a received signal. Diode 5311 has an anode coupled to a second rectifying output terminal 5212, and a cathode coupled to a second pin 5202. Diode 5312 has an anode coupled to second rectifying output terminal 5212, and a cathode coupled to a first pin 5201. Diode 5313 has an anode coupled to second pin 5202, and a cathode coupled to a first rectifying output terminal 5211. And diode 5314 has an anode coupled to first pin 5201, and a cathode coupled to first rectifying output terminal 5211. In this embodiment, diodes 5311-5314 may be referred to as first diode 5311, second diode 5312, third diode 5313, and fourth diode 5314.

Operations of rectifying circuit 5310 when first and second pins 5201 and 5202 receive an AC signal as external driving signal Pin are described as follows.

During the AC signal's positive half cycle, assuming the voltage level at first pin 5201 being higher than that at second pin 5202, diodes 5311 and 5314 operate in a forward-biased state to conduct current, while diodes 5312 and 5313 are cut off as being reverse-biased, which states of the four diodes form a circuit loop between the first and second pins 5201 and 5202. Under the configuration of the diodes during the AC signal's positive half cycle, an input current from or caused by the AC signal flows through first pin 5201, diode 5314, and first rectifying output terminal 5211 in sequence into a later-stage load, and after which flows through second rectifying output terminal 5212, diode 5311, and second pin 5202 in sequence, out of the LED filament bulb. Accordingly, during the AC signal's negative half cycle, the voltage level at first pin 5202 is higher than that at second pin 5201, so diodes 5312 and 5313 operate in a forward-biased state to conduct current, while diodes 5311 and 5314 are cut off as being reverse-biased, which states of the four diodes form a circuit loop between first and second pins 5201 and 5202. Under the configuration of the diodes during the AC signal's negative half cycle, an input current from or caused by the AC signal flows through second pin 5202, diode 5313, and first rectifying output terminal 5211 in sequence into a later-stage load, and after which flows through second rectifying output terminal 5212, diode 5312, and first pin 5201 in sequence, out of the LED filament bulb. Therefore, no matter during the AC signal's positive or negative half cycle, the positive polarity of rectified signal Srec output by rectifying circuit 5310 remains at first rectifying output terminal 5211 and the negative polarity of rectified signal Srec remains at second rectifying output terminal 5212. According to the above description of operations, the rectified signal output by rectifying circuit 5210 is a full-wave rectified signal.

Operations of rectifying circuit 5310 when first and second pins 5201 and 5202 are coupled to a DC power supply to receive a DC signal therefrom as external driving signal Pin are described as follows. When first pin 5201 is coupled to the positive electrode, and second pin 5202 is coupled to the negative electrode, of the DC power supply, diodes 5311 and 5314 operate in a forward-biased state to conduct current, while diodes 5312 and 5313 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's positive half cycle. On the other hand, when first pin 5201 is coupled to the negative electrode, and second pin 5202 is coupled to the positive electrode, of the DC power supply, diodes 5312 and 5313 operate in a forward-biased state to conduct current, while diodes 5311 and 5314 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's negative half cycle.

From the above description, it is known that no matter whether rectifying circuit 5310 in this embodiment receives an AC signal or a DC signal, rectifying circuit 5310 can properly output rectified signal Srec.

Besides, in some embodiments, a capacitor Cx may be disposed between input terminals of rectifying circuit 5310, wherein capacitance of capacitor Cx may be for example 47 nF and capacitor Cx may be used to reduce EMI (: electromagnetic interference) effects of power module 5200.

Figure 15B:
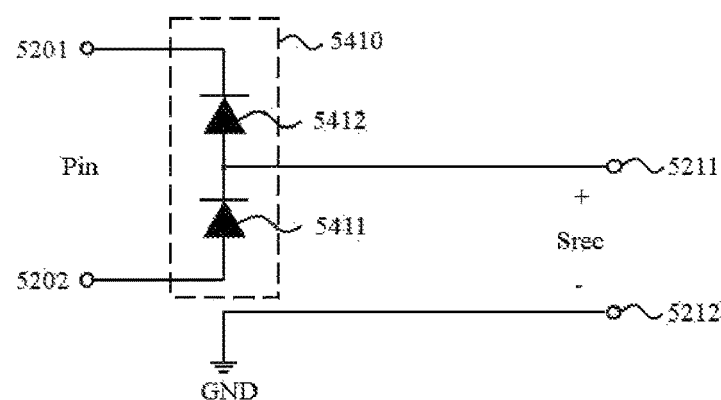
FIG. 15B is a schematic diagram of a rectifying circuit in accordance with another embodiment of the present invention.

FIG. 15B is a circuit diagram of a rectifying circuit according to some embodiment of present invention. Referring to FIG. 15B, rectifying circuit 5410 includes diodes 5411 and 5412 used for performing (half-wave) rectification to a received signal. Diode 5411 has an anode coupled to second pin 5202, and a cathode coupled to first rectifying output terminal 5211. Diode 5412 has an anode coupled to first rectifying output terminal 5211, and a cathode coupled to first pin 5201. Depending on practical applications involving rectifying circuit 5210, second rectifying output terminal 5212 may be omitted or grounded. In this embodiment, diodes 5411 and 5412 may be referred to as a first diode 5411 and a second diode 5412.

Next, in a similar vein, what follows are descriptions of operations of rectifying circuit 5410 under the two operational situations of when the received signal is an AC signal and when the received signal is a DC signal, respectively.

Operations of rectifying circuit 5410 when first and second pins 5201 and 5202 receive an AC signal as external driving signal Pin are described as follows. During the AC signal's positive half cycle, assuming the input voltage level at first pin 5201 from the AC signal being higher than that at second pin 5202, diodes 5411 and 5412 are in a reverse-biased state, so rectifying circuit 5410 ceases to output rectified signal Srec, or rectified signal Srec output by rectifying circuit 5410 is at a zero level. On the other hand, during the AC signal's negative half cycle, the input voltage level at first pin 5201 from the AC signal is lower than that at second pin 5202, so diodes 5411 and 5412 operate in a forward-biased state to conduct current, causing the AC signal to flow through diode 5411 and first rectifying output terminal 5211 into a later-stage load, after which the current of the AC signal flowing out through second rectifying output terminal 5212, another circuit of the LED filament bulb, or a ground terminal. According to the above description of operations, the rectified signal output by rectifying circuit 5410 is a half-wave rectified signal.

Operations of rectifying circuit 5410 when first and second pins 5201 and 5202 are coupled to a DC power supply to receive a DC signal as external driving signal Pin are described as follows. When first pin 5201 is coupled to the positive electrode, and second pin 5202 is coupled to the negative electrode, of the DC power supply, diodes 5411 and 5412 are cut off as being reverse-biased, so rectifying circuit 5410 ceases to output rectified signal Srec. On the other hand, when first pin 5201 is coupled to the negative electrode, and second pin 5202 is coupled to the positive electrode, of the DC power supply, diodes 5411 and 5412 operate in a forward-biased state to conduct current forming a circuit loop, so in this case the circuit configuration and operations of rectifying circuit 5410 are the same as those of rectifying circuit 5410 under and during the above-described AC signal's negative half cycle. From this description, in this embodiment, when first pin 5201 is coupled to the negative electrode, and second pin 5202 is coupled to the positive electrode, of the DC power supply, the rectifying circuit 5410 can still operate normally.

Figure 16A:
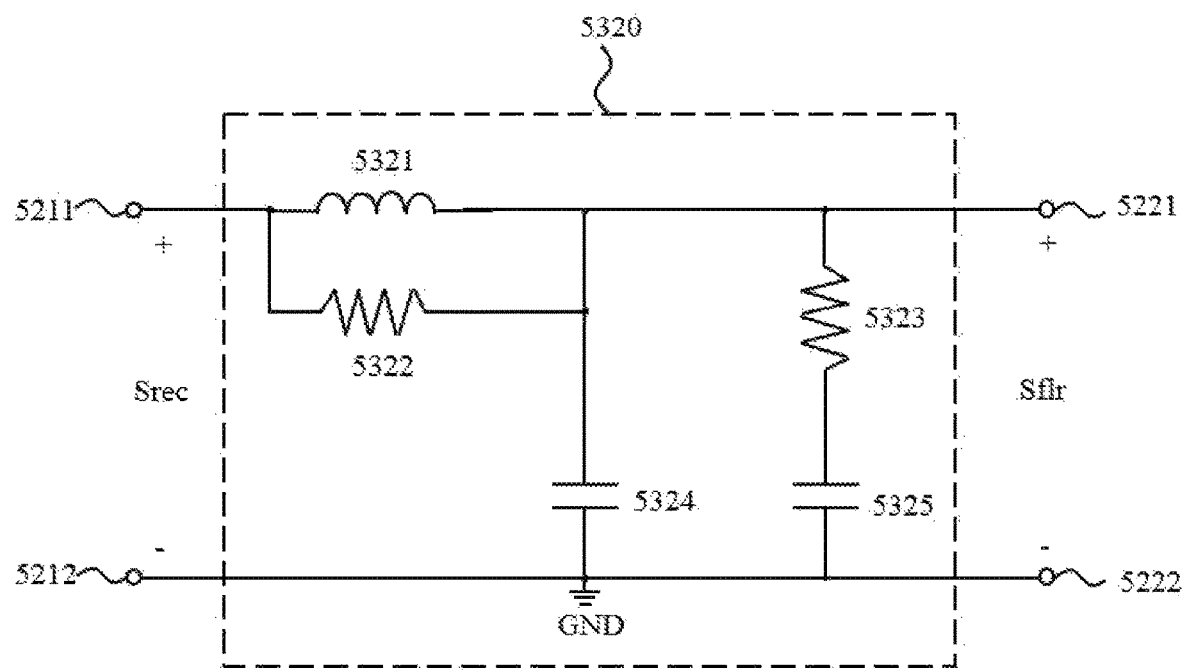
FIG. 16A is a schematic diagram of a filtering circuit in accordance with an embodiment of the present invention.

FIG. 16A is a circuit diagram of a filtering circuit according to some embodiments of present invention. Referring to FIG. 16A, the filtering circuit 5320 includes an inductor 5321, resistors 5322 and 5323, and capacitors 5324 and 5325. Inductor 5321 has a first end coupled to first rectifying output terminal 5211, and has a second end coupled to a first filtering output terminal 5221. So inductor 5321 is electrically connected between first rectifying output terminal 5211 and first filtering output terminal 5221 in series. Resistor 5322 has a first end coupled to first rectifying output terminal 5211 and the first end of inductor 5321, and has a second end coupled to first filtering output terminal 5221 and the second end of inductor 5321. So resistor 5322 and inductor 5321 are electrically connected in parallel. Resistor 5323 has a first end coupled to first filtering output terminal 5221 and the second end of inductor 5321. Capacitor 5324 has a first end coupled to first filtering output terminal 5221 and the second end of inductor 5321, and has a second end coupled to second rectifying output terminal 5212 and second filtering output terminal 5222, wherein second rectifying output terminal 5212 and second filtering output terminal 5222 may be regarded as the same terminal and/or a ground terminal GND. Capacitor 5325 has a first end coupled to a second end of resistor 5323, and has a second end coupled to second rectifying output terminal 5212 and second filtering output terminal 5222. Under the structure and configuration of filtering circuit 5320 in this embodiment, filtering circuit 5320 can perform low-pass filtering to rectified signal Srec, to filter out high-frequency components of rectified signal Srec so as to produce a filtered signal Sflr then output through first and second filtering output terminals 5221 and 5222.

Figure 16B:
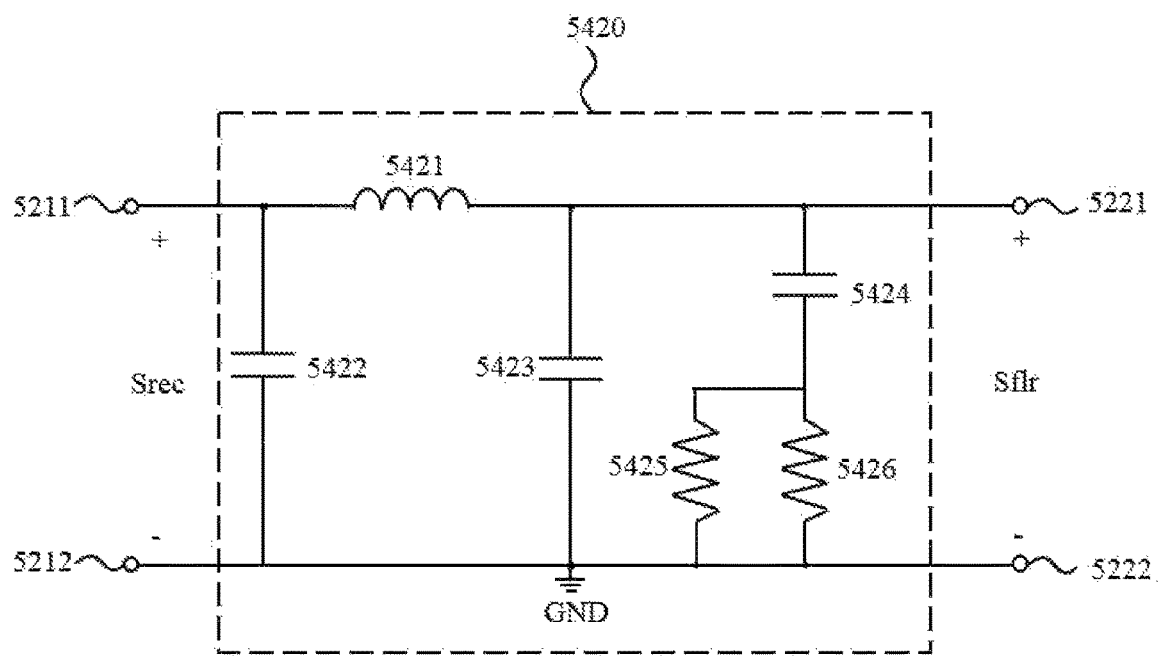
FIG. 16B is a schematic diagram of a filtering circuit in accordance with another embodiment of the present invention.

FIG. 16B is a circuit diagram of a filtering circuit according to some embodiments of the present invention. Referring to FIG. 16B, filtering circuit 5420 comprises a π-shape filtering circuit and includes an inductor 5421, capacitors 5422, 5423, and 5424, and resistors 5425 and 5426. Inductor 5421 has a first end coupled to first rectifying output terminal 5211, and has a second end coupled to a first filtering output terminal 5221. So inductor 5421 is electrically connected between first rectifying output terminal 5211 and first filtering output terminal 5221 in series. Capacitor 5422 has a first end coupled to first rectifying output terminal 5211 and first end of inductor 5421, and has a second end coupled to second rectifying output terminal 5212 and a second filtering output terminal 5222, so the first end of capacitor 5422 is coupled to first filtering output terminal 5221 through inductor 5421. Capacitor 5423 has a first end coupled to first filtering output terminal 5221 and the second end of inductor 5421, and has a second end coupled to second rectifying output terminal 5212 and second filtering output terminal 5222, so the first end of capacitor 5423 is coupled to first rectifying output terminal 5211 through inductor 5421. Capacitor 5424 has a first end coupled to first filtering output terminal 5221 and the second end of inductor 5421, and has a second end coupled to first ends respectively of resistors 5425 and 5426, whose respective second ends are coupled to second rectifying output terminal 5212 and second filtering output terminal 5222.

By way of structural equivalence, the positional structure of inductor 5421 and capacitor 5423 of filtering circuit 5420 is similar to that of inductor 5321 and capacitor 5324 of filtering circuit 5320. Compared to filtering circuit 5320 in FIG. 16A, filtering circuit 5420 further includes capacitor 5422, which is similar to inductor 5421 and capacitor 5423 in having a low-pass filtering function. So compared to filtering circuit 5320 in FIG. 16A, filtering circuit 5420 has better ability to filter out high-frequency components, which ability causes the waveform of its output filtered signal Sflr to be smoother.

Inductors 5321 and 5421 in the above embodiments each have an inductance preferably in the range of about 10 nH~10 mH. And capacitors 5324, 5325, 5422, 5423, and 5424 each have a capacitance preferably in the range of about 100 pF~1 uF.

Figure 17:
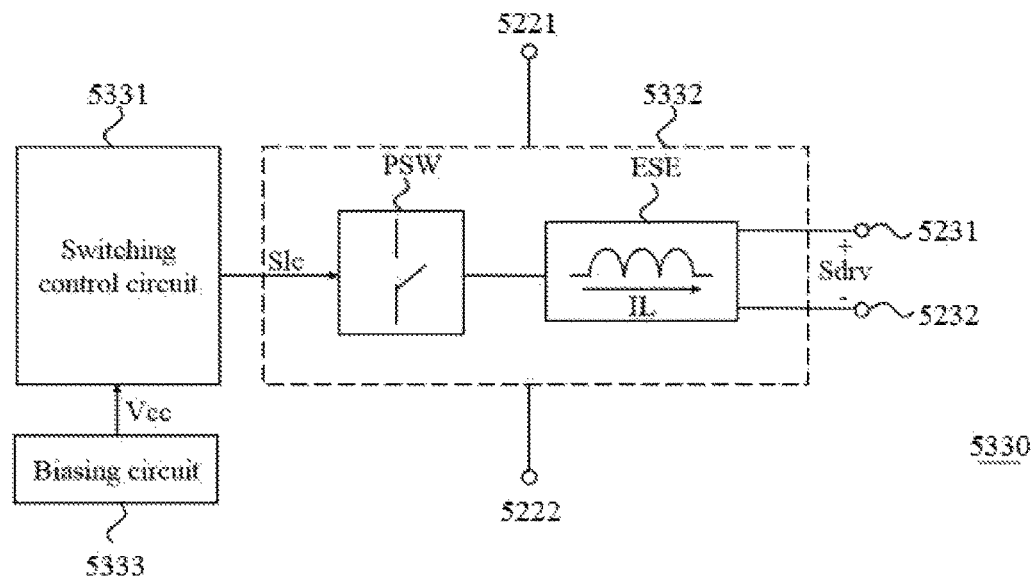
FIG. 17 is a block diagram of a driving circuit in accordance with an embodiment of the present invention.

FIG. 17 is a circuit diagram of a driving circuit according to some embodiments of the present invention. Referring to FIG. 17, the driving circuit 5330 includes a switching control circuit 5331 and a conversion circuit 5332, for performing power conversion based on, or in a mode of being, a current source, in order to drive the LED filament module to emit light. Conversion circuit 5332 includes a switching circuit PSW (which may be referred to as a power switch) and an energy storage circuit ESE. And conversion circuit 5332 is coupled to first and second filtering output terminals 5221 and 5222 to receive and then convert filtered signal Sflr, under the control by switching control circuit 5331, into a driving power Sdrv to be output at a first and a second driving output terminals 5231 and 5232 for driving the LED filament module. Under the control by switching control circuit 5331, driving power Sdrv output by conversion circuit 5332 comprises a steady current, causing the LED filament module to steadily emit light. Besides, driving circuit 5330 may further include a biasing circuit 5333, which may be configured to generate working voltage Vcc based on voltage on an input power line of the power module, wherein working voltage Vcc is provided to and used by switching control circuit 5331, so that switching control circuit 5331 can be activated and then operate in response to working voltage Vcc.

Figure 18A:
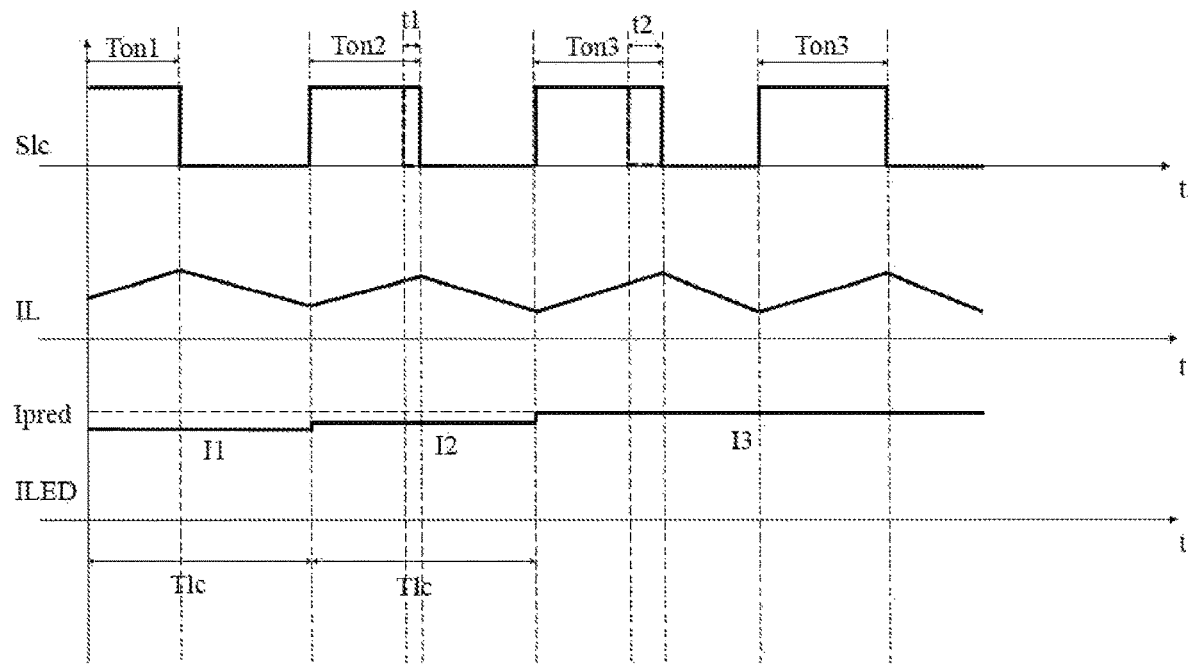
FIGS. 18A to 18D are schematic diagrams showing signal waveforms of a driving circuit in accordance with various embodiments of the present invention.
Figure 18B:
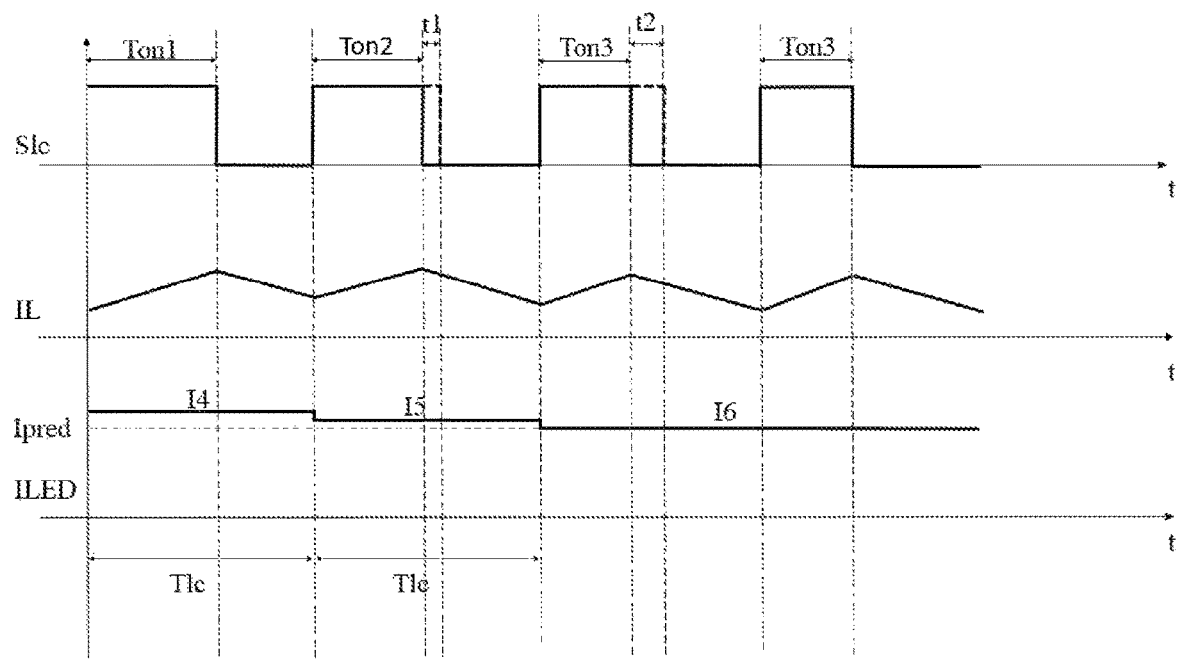
Figure 18C:
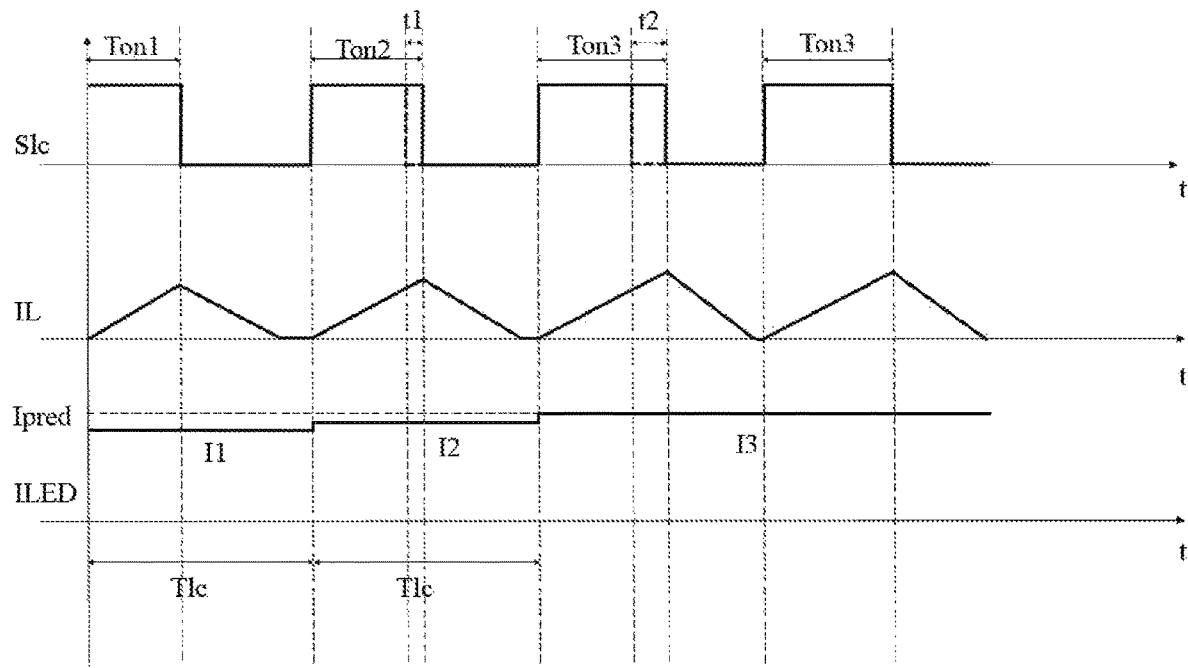
Figure 18D:
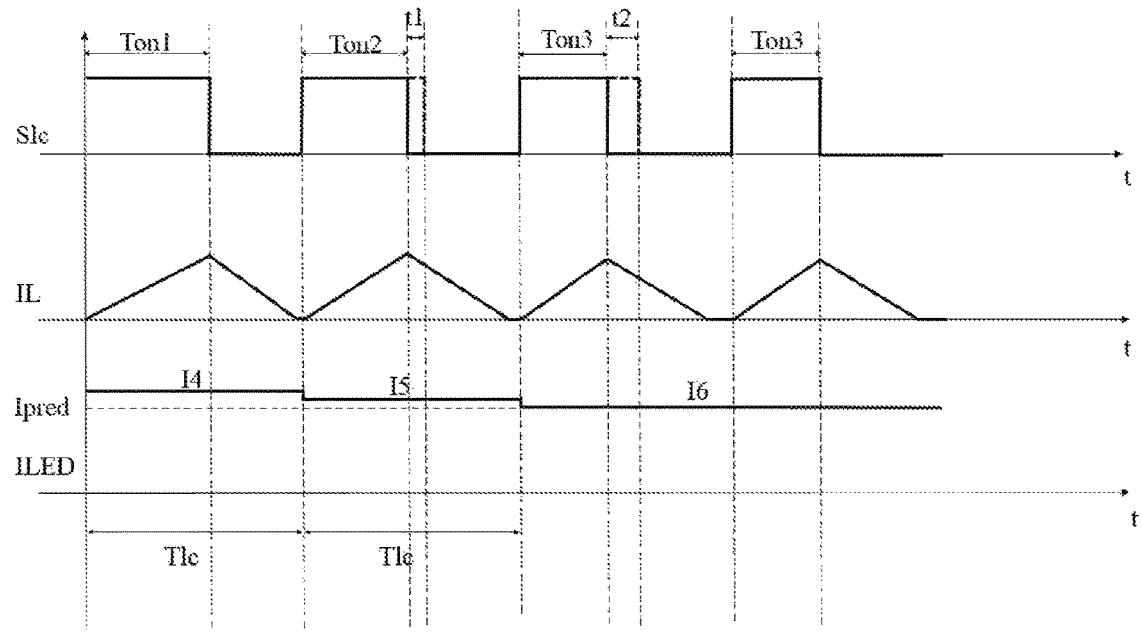

Next, operations of driving circuit 5330 are further described with reference to the illustrating signal waveforms shown in FIGS. 18A-18D. FIGS. 18A-18D are signal waveform diagrams related to and in different embodiments of operating the driving circuit (5230/5330). FIGS. 18A and 18B illustrate signal waveforms and control situation in an embodiment of operating driving circuit 5330 in a continuous-conduction mode (CCM). FIGS. 18C and 18D illustrate signal waveforms and control situation in an embodiment of operating driving circuit 5330 in a discontinuous-conduction mode (DCM). In the signal-waveform diagrams, the horizontal axis represents time, which is denoted by "t", and the vertical axis represents the variable of voltage or current depending on which type of signal is being described or referred to.

Switching control circuit 5331 in this embodiment is configured to perform real-time regulation or adjusting of the duty cycle of a lighting control signal Slc according to current operational states of the LED filament bulb, in order to turn on or turn off switching circuit PSW according to or in response to lighting control signal Slc. Switching control circuit 5331 can determine or judge a current operational state of the LED filament bulb by detecting one or more of an input voltage (such as a voltage level on first pin 5201 or second pin 5202, on first rectifying output terminal 5211, or on first filtering output terminal 5221), an output voltage (such as a voltage level on first driving output terminal 5231), an input current (such as a current on the input power line or flowing through rectifying output terminal 5211/5212 and filtering output terminal 5221/5222), and an output current (such as a current flowing through driving output terminal 5231/5232 or through switching circuit PSW). Energy storage circuit ESE is configured to alternate or switch its operation between being charged with energy and discharging energy, according to the state of switching circuit PSW being turned on or turned off, in order to maintain or make a driving current ILED received by the LED filament module be stably above a predefined current value Ipred. Lighting control signal Slc has a fixed signal period TIc and a signal amplitude, wherein the pulse on time (such as Ton1, Ton2, or Ton3, and also referred to as a pulse width) during each of signal period TIc may be adjusted according to control needs. And the duty cycle of lighting control signal Slc is the ratio of the pulse on time to signal period TIc. For example, if pulse on time Ton1 is 40% of signal period TIc, this means the duty cycle of lighting control signal Slc during first signal period TIc is 0.4.

FIG. 18A illustrates variations in signal waveforms during multiple consecutive signal periods TIc related to operating driving circuit 5330 when driving current ILED is below predefined current value Ipred. Referring to both FIG. 17 and FIG. 18A, specifically, during first signal period TIc, switching circuit PSW conducts current during pulse on time Ton1 when lighting control signal Slc is at a high level. So during pulse on time Ton1, in addition to generating driving current ILED for LED filament module 100 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to the LED filament module, but instead energy storage circuit ESE discharges electrical energy to generate driving current ILED for the LED filament module, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to the LED filament module due to the energy discharging from and by energy storage circuit ESE. In other words for this case, no matter whether switching circuit PSW is turned on or turned off, driving circuit 5330 will continually provide a stable driving current ILED to the LED filament module, wherein the current value of driving current ILED during first signal period TIc is about I1 as shown in FIG. 18A.

During first signal period TIc, switching control circuit 5331 judges that current value I1 of driving current ILED is below a predefined current value Ipred, according to a current detection signal indicative of a working state of the LED filament. Thus upon entering into second signal period TIc, switching control circuit 5331 adjusts the pulse on time of lighting control signal Slc into Ton2, which is equal to pulse on time Ton1 plus a unit duration t1.

During second signal period TIc, operations of switching circuit PSW and energy storage circuit ESE are similar to their operations during the previous or first signal period TIc. The difference(s) in operations between two signal periods TIc is mainly that since pulse on time Ton2 is longer than pulse on time Ton1, the charging time and discharging time of energy storage circuit ESE during second signal period TIc are longer and shorter respectively than their counterparts during first signal period TIc, causing an average value I2 of driving current ILED provided by driving circuit 5330 during second signal period TIc higher than current value I1 and closer to predefined current value Ipred.

Similarly, since at this stage current value I2 of driving current ILED is still below predefined current value Ipred, during third signal period TIc switching control circuit 5331 again adjusts the pulse on time of lighting control signal Slc into Ton3, which is equal to pulse on time Ton2 plus unit duration t1 or equal to pulse on time Ton1 plus duration t2 of 2 unit durations t1. During third signal period TIc, operations of switching circuit PSW and energy storage circuit ESE are similar to their operations during each of first two signal periods TIc. Because pulse on time Ton3 is further longer than pulse on time Ton2, the current value of driving current ILED provided by driving circuit 5330 during third signal period TIc is raised to I3 approximately reaching predefined current value Ipred. Afterwards, since current value I3 of driving current ILED during third signal period TIc has reached predefined current value Ipred, switching control circuit 5331 maintains a constant duty cycle of lighting control signal Slc, to maintain the current value of driving current ILED continually at predefined current value Ipred.

FIG. 18B illustrates variations in signal waveforms during multiple consecutive signal periods TIc related to operating driving circuit 5330 when driving current ILED is above predefined current value Ipred. Referring to both FIG. 17 and FIG. 18B, specifically, during first signal periods TIc shown in FIG. 18B, switching circuit PSW conducts current during pulse on time Ton1 when lighting control signal Slc is at a high level. So during pulse on time Ton1, in addition to generating driving current ILED for LED filament module 18 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to LED filament module 100, but instead energy storage circuit ESE discharges electrical energy to generate driving current ILED for LED filament module 100, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to LED filament module 100 due to the energy discharging from and by energy storage circuit ESE. In other words for this case, no matter whether switching circuit PSW is turned on or turned off, driving circuit 5330 will continually provide a stable driving current ILED to LED filament module 100, wherein the current value of driving current ILED during first signal period TIc is about I4 as shown in FIG. 18B.

During first signal period TIc, switching control circuit 5331 judges that current value I4 of driving current ILED is above a predefined current value Ipred, according to a current detection signal Sdet. Thus upon entering into second signal period TIc, switching control circuit 5331 adjusts the pulse on time of lighting control signal Slc into Ton2, which is equal to pulse on time Ton1 minus a unit duration t1.

During second signal period TIc, operations of switching circuit PSW and energy storage circuit ESE are similar to their operations during previous or first signal period TIc. The difference(s) in operations between two signal periods TIc is mainly that since pulse on time Ton2 is shorter than pulse on time Ton1, the charging time and discharging time of energy storage circuit ESE during second signal period TIc are shorter and longer respectively than their counterparts during first signal period TIc, causing an average value I5 of driving current ILED provided by driving circuit 5330 during second signal period TIc lower than current value I4 and closer to predefined current value Ipred.

Similarly, since at this stage current value I5 of driving current ILED is still above predefined current value Ipred, during third signal period TIc switching control circuit 5331 again adjusts the pulse on time of lighting control signal Slc into Ton3, which is equal to pulse on time Ton2 minus unit duration t1 or equal to pulse on time Ton1 minus duration t2 of 2 unit durations t1. During third signal period TIc, operations of switching circuit PSW and energy storage circuit ESE are similar to their operations during each of first two signal periods TIc. Because pulse on time Ton3 is further shorter than pulse on time Ton2, the value of driving current ILED provided by driving circuit 5330 during third signal period TIc is lowered to I6 approximately reaching predefined current value Ipred. Afterwards, since current value I6 of driving current ILED during third signal period TIc has reached predefined current value Ipred, switching control circuit 5331 maintains a constant duty cycle of lighting control signal Slc, to maintain the current value of driving current ILED continually at predefined current value Ipred.

From the above descriptions of the embodiments of both FIGS. 18A and 18B, it's seen that driving circuit 5330 adjusts the pulse width or pulse on time of lighting control signal Slc for each of consecutive signal periods TIc, in a stepping manner depending on the level of driving current ILED in relation to predefined current value Ipred, to gradually bring the value of driving current ILED above or below predefined current value Ipred to approach or be closer to predefined current value Ipred, so as to realize outputting of a stable or constant current.

In addition, the above embodiments of FIGS. 18A and 18B are examples of operating driving circuit 5330 in a continuous-conduction mode, wherein when switching circuit PSW is turned off energy storage circuit ESE does not discharge current to the extent that current signal IL flowing through energy storage circuit ESE decreases to zero. By using driving circuit 5330 operating in the continuous-conduction mode to provide power for the LED filament module, the electrical power provided to the LED filament module is relatively stable and is not likely to cause signal ripples.

Next are descriptions of embodiments of a control situation of operating driving circuit 5330 in a discontinuous-conduction mode. Referring to both FIG. 17 and FIG. 18C, the signal waveforms and operations of the driving circuit 5330 shown by FIG. 18C are similar to those shown by FIG. 18A. The difference(s) between the two embodiments of FIG. 18C and FIG. 18A is mainly that because driving circuit 5330 in this embodiment of FIG. 18C operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period TIc. Apart from this difference, description of other operations of this embodiment of FIG. 18C can be referred to the above description of the embodiment of FIG. 18A and so is not repeated again.

Then referring to both FIG. 17 and FIG. 18D, the signal waveforms and operations of driving circuit 5330 shown by FIG. 18D are similar to those shown by FIG. 18B. The difference(s) between the two embodiments of FIG. 18D and FIG. 18B is mainly that because driving circuit 5330 in this embodiment of FIG. 18D operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period TIc. Apart from this difference, description of other operations of this embodiment of FIG. 18D can be referred to the above description of the embodiment of FIG. 18B and so is not repeated again.

By using driving circuit 5330 operating in the discontinuous-conduction mode to provide power for the LED filament module, energy or power loss incurred in performing power conversion by driving circuit 5330 can be reduced, thereby resulting in a higher conversion efficiency. The following are descriptions to introduce and further explain several concrete circuit examples of driving circuit 5330.

Figure 19A:
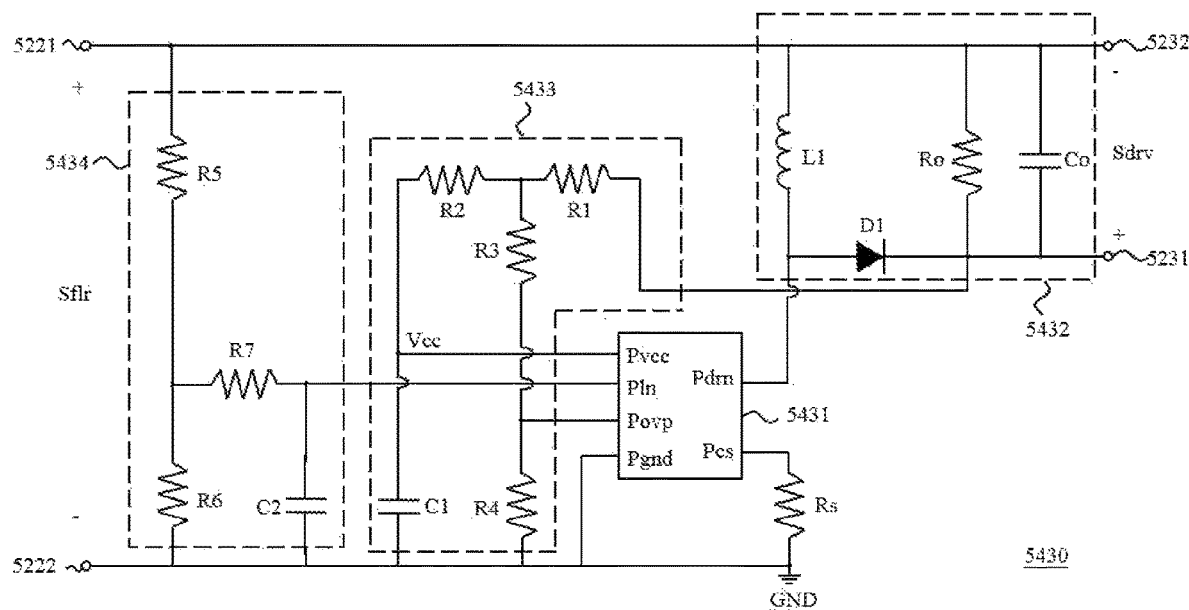
FIG. 19A is a perspective diagram of a driving circuit in accordance with an embodiment of the present invention.

FIG. 19A is a circuit diagram of a driving circuit according to some embodiments of the present invention. Referring to FIG. 19A, in this embodiment, driving circuit 5430 comprises a buck DC-to-DC converter circuit, including a controller 5431, an output circuit 5432, a biasing circuit 5433 and a sampling circuit 5434. Driving circuit 5430 is coupled to first filtering output terminal 5221 and second filtering output terminal 5222 to convert received filtered signal Sflr to driving power Sdrv for driving the LED filament module coupled between first and second driving output terminals 5231 and 5232.

Controller 5431 includes for example an integrated-circuit chip, which has a drain-terminal or drain pin Pdrn, a source-terminal or source pin Pcs, an power pin Pvcc, a voltagesampling pin Pln, an overvoltage protection pin Povp, and a ground pin Pgnd. Drain pin Pdrn is coupled to output circuit 5432. Source pin Pcs is coupled to second filtering output terminal 5222 and ground terminal GND through a resistor Rs. Power pin Pvcc and overvoltage protection pin Povp are coupled to biasing circuit 5433. Voltage sampling pin Pln is coupled to sampling circuit 5434. And ground pin Pgnd is coupled to second filtering output terminal 5222 and ground terminal GND.

In this embodiment of FIG. 19A, the above-mentioned switching circuit or power switch (PSW) of conversion circuit 5332 is for example integrated in controller 5431, and has first and second terminals electrically connected to drain pin Pdrn and source pin Pcs respectively. Therefore, controller 5431 can determine current conduction or cutoff at or through drain pin Pdrn, source pin Pcs, and/or corresponding current path(s), by controlling switching of its internal switching circuit between, or into one of, conduction and cutoff states. In some other embodiments, the above-mentioned switching circuit is a discrete device disposed external to controller 5431. In applications using a discrete device as switching circuit, definitions or connection-structure of pins of controller 5431 would be adjusted accordingly, such as setting drain pin Pdrn as a pin to be electrically connected to a control terminal of the discrete switching circuit instead and for providing a lighting control signal.

Output circuit 5432 includes a diode D1, an inductor L1, a capacitor Co, and a resistor Ro, wherein inductor L1 and capacitor Co act as (part of) the energy storage circuit (ESE) of conversion circuit 5332. Diode D1 acts as a freewheeling diode; has its anode coupled to drain pin Pdrn of controller 5431 so as to be coupled through drain pin Pdrn to the first or drain terminal of the switching circuit (PSW) within controller 5431; and has its cathode coupled to first driving output terminal 5231 Inductor L1 has a first end coupled to the anode of the diode D1 and the drain pin Pdrn of the controller 5431, and has a second end coupled to first filtering output terminal 5221 and second driving output terminal 5232. Resistor Ro and capacitor Co are electrically connected in parallel and coupled between first and second driving output terminals 5231 and 5232. In this embodiment, first filtering output terminal 5221 and second driving output terminal 5232 can be regarded as the same terminal.

In this embodiment of FIG. 19A, the controller 5431 is configured to control current conduction or cutoff on a path between drain pin Pdrn and source pin Pcs. When there is current conduction on the path between drain pin Pdrn and source pin Pcs, a current flows from first filtering output terminal 5221 into driving circuit 5430, and flows through inductor L1 and drain pin Pdrn into controller 5431, and then flows through source pin Pc and second filtering output terminal 5222 to ground terminal GND. In this case of current conduction, the current flowing through inductor L1 increases with time and causes inductor L1 to be in a state of storing electrical energy; while the voltage across capacitor Co decreases with time and causes capacitor Co to be in a state of releasing electrical energy in order to maintain the LED filament module as emitting light. On the other hand, when the path between drain pin Pdrn and source pin Pcs is in a cutoff state or not conducting current, inductor L1 is in a state of releasing or discharging electrical energy and the current flowing through inductor L1 decreases with time. In this cutoff case the current flowing through inductor L1 flows through diode D1, first driving output terminal 5231, the LED filament module, second driving output terminals 5232, and then back to inductor L1, forming a current flyback; and capacitor Co is in a state of storing electrical energy with its voltage increasing with time.

It should be noted that capacitor Co may be omitted. When capacitor Co is omitted, and there is current conduction on the path between drain pin Pdrn and source pin Pcs, a current flowing through inductor L1 doesn't flow through first filtering output terminal 5221 and second driving output terminal 5232, so the LED filament module does not emit light. But when the path between drain pin Pdrn and source pin Pcs is in a cutoff state, a current flowing through inductor L1 flows through freewheeling diode D1 to the LED filament module to cause the LED filament to emit light. By adjusting or controlling the duration of light emission by the LED filament and the magnitude of current flowing through the LED filament module, an average luminance of the emitted light stable above a defined value can be achieved, so as to achieve a favorable function of emitting stable light. Apart from the above, since driving circuit 5430 of this embodiment takes a non-isolation power-conversion structure, feedback control, if any, of switching circuit or power switch (PSW) performed by controller 5431 may be based on detecting a magnitude of current flowing through the switching circuit or power switch.

In another aspect, driving circuit 5430 keeps the current flowing through the LED module unvariable, so for some LED modules (for example, white, red, blue and green LED modules), it can be improved that color temperature changes with current. In other words, the LED module can keep color temperature constant under different current intensity. Inductor L1 which serves as an energy storage circuit releases stored energy when the switching circuit turns off. This makes not only the LED filament keep lighting but also the current in the LED filament does not suddenly drop to the lowest value. When the switching circuit turns on again, it is unnecessary that both current and voltage goes from the lowest value to the highest value. Thereby, discontinuous lighting of LED filament can be avoided to cause the luminance of the LED filament being varied, to decrease the lowest conducting cycle and to raise the driving frequency.

Biasing circuit 5433 includes capacitor C1 and resistors R1-R4. A first end of capacitor C1 is electrically connected to power pin Pvcc. A second end of capacitor C1 is electrically connected to second filtering output terminal 5222 and ground terminal GND. A first end of resistor R1 is electrically connected second driving output terminal 5232. A first end of resistor R2 is electrically connected to a second end of resistor R1. A second end of resistor R2 is electrically connected to the first end of capacitor C1 and power pin Pvcc. A first end of resistor R3 is electrically connected a second end of resistor R1 and the first end of resistor R2. A second end of resistor R3 is electrically connected to overvoltage protection pin Povp of controller 5431. A first end of resistor R4 is electrically connected to the second end of resistor R3. A second end of resistor R4 is electrically connected to both second filtering output terminal 5222 and ground terminal GND.

Resistors R1 and R2 acquire a voltage of second driving output terminal 5232 to generate working voltage Vcc. Working voltage Vcc is stabilized by capacitor C1 and transmitted to power pin Pvcc for being used by controller 5431. Resistors R3 and R4 acquire or sample a voltage of second driving output terminal 232 by voltage division so that controller 5431 can determine if the overvoltage protection function should be executed or not according to the voltage of overvoltage protection pin Povp.

Sampling circuit 5434 includes capacitor C2 and resistors R5-R7. A first end of capacitor C2 is electrically connected to voltage sampling pin Pln. A second end of capacitor C2 is electrically connected to both second filtering output terminal 5222 and ground terminal GND. A first end of resistor R5 is electrically connected to both first filtering output terminal 5221 and second driving output terminal 5232. A first end of resistor R6 is electrically connected to a second end of resistor R5. A second end of resistor R6 is electrically connected to both second filtering output terminal 5222 and ground terminal GND. A first end of resistor R7 is electrically connected to both the second end of resistor R7 and the first end of resistor R6. A second end of resistor R7 is electrically connected to both voltage sampling pin Pln and the first end of capacitor C2.

Resistors R5 and R6 acquire or sample a voltage of the power line (i.e. the voltage of first filtering output terminal 5221) by voltage division. The sampled voltage is transmitted to voltage sampling pin Pln of controller 5431 through resistor R7. Capacitor C2 is used for stabilizing a voltage of voltage sampling pin Pin.

Figure 19B:
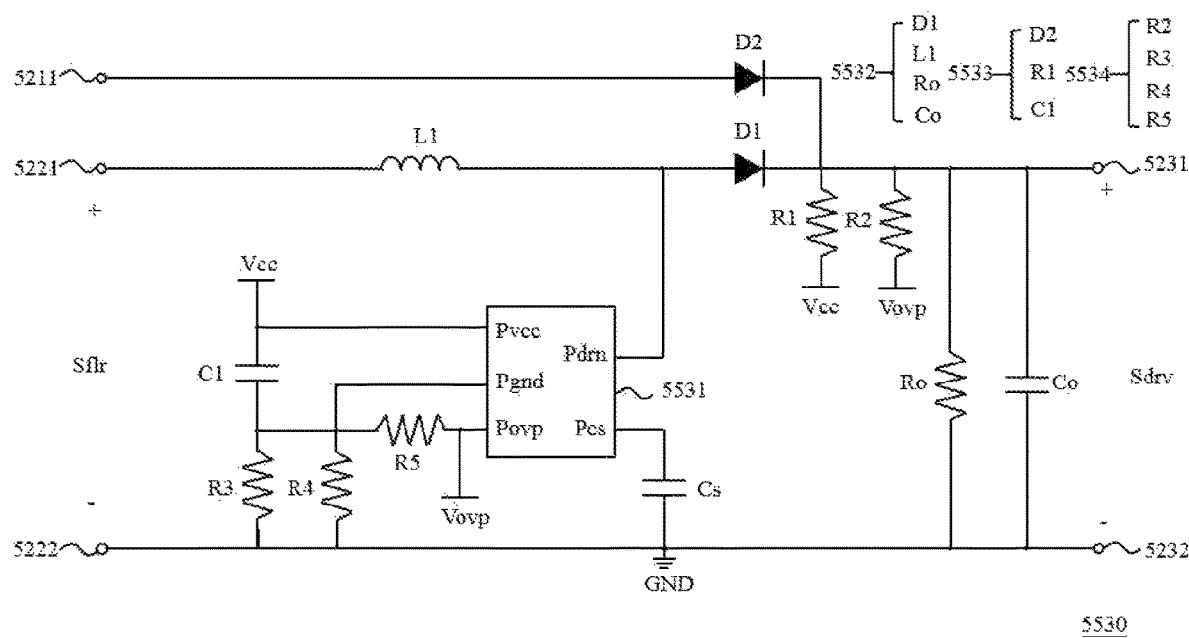
FIG. 19B is a perspective diagram of a driving circuit in accordance with another embodiment of the present invention.

Please refer to FIG. 19B, which is a schematic circuit diagram of the driving circuit according to some embodiments of the present invention. In this embodiment, a boost DC-to-DC converter serves as the driving circuit 5530 as an example, which includes controller 5531, output circuit 5532, biasing circuit 5533 and sampling circuit 5534. The driving circuit is electrically connected to both first filtering output terminal 5221 and second filtering terminal 5222 for converting the received filtered signal Sflr into a driving power Sdrv to drive the LED filament module electrically connected between first and second driving output terminals 5231 and 5232. In addition, driving circuit 5530 is further electrically connected to first rectifying output terminal 5211 for acquiring voltage of the power line (or bus line) to generate working voltage Vcc.

Controller 5531 may be an integrated circuit or a chip including drain pin Pdrn, source pin Pcs, power pin Pvcc, overvoltage protection pin Povp and ground pin Pgnd. Drain pin Pdrn is electrically connected to output circuit 5532. Source pin Pcs is electrically connected to second filtering output terminal 5222, second driving output terminal 5532 and ground terminal GND through capacitor Cs. Power pin Pvcc is electrically connected to biasing circuit 5533. Overvoltage protection pin Povp is electrically connected to sampling circuit 5534. Ground pin Pgnd is electrically connected to both biasing circuit 5533 and sampling circuit 5534.

In this embodiment, the switching circuit/power switch (PSW) may be integrated in controller 5531, and the first end and the second end of the switching circuit are electrically connected to drain pin Pdrn and source pin Pcs, respectively. In other words, controller 5531 can determine switch-on or switch-off of a current path related to drain pin Pdrn and source pin Pcs by controlling the switching state of the switching circuit within controller 5531. In another embodiments, the switching circuit may also be a discrete element which is not integrated into controller 5531. Under such a situation using a discrete element as a switching circuit, definition of pinout of controller 5531 will be correspondingly adjusted. For example, drain pin Pdrn can be adjusted to connect to a control end of the switching circuit and to serve as a pin providing a lighting control signal.

Output circuit 5532 includes diode D1, inductor L1, capacitor Co and resistor Ro. Both inductor L1 and capacitor C1 serve as an energy storage circuit (ESE) of the converting circuit. Diode D1 serves as a freewheeling diode, whose anode is electrically connected to drain pin Pdrn of controller 5531 by connecting drain pin Pdrn to the first end/drain of the switching circuit in controller 5531. The cathode of diode D1 is electrically connected to first driving output terminal 5231. The first end of inductor L1 is electrically connected to first filtering output terminal 5221. The second end of inductor L1 is electrically connected to both drain pin Pdrn of controller 431 and the anode of diode D1. Resistor Ro and capacitor Co are electrically connected in parallel and electrically connected between first driving output terminal 5231 and second driving output terminal 5232. In this embodiment, first filtering output terminal 5221 is electrically connected to first driving output terminal 5231 via both diode D1 and inductor L1.

Controller 5531 controls switch-on and switch-off between drain pin Pdrn and source pin Pcs. When circuit between drain pin Pdrn and source pin Pcs is switched on, current will flow in first filtering output terminal 5521 to controller 5531 via inductor L1 and drain pin Pdrn, and finally flow to ground terminal GND via source pin Pcs, capacitor Cs and second filtering output terminal 5222. At this time, current flowing through inductor L1 increases with time and inductor L1 is in a status of energy storing. Meanwhile, capacitor Co is in a status of energy releasing to drive the LED filament module to emit light. When drain pin Pdrn and source pin Pcs are switched off, inductor L1 is in a status of energy releasing, and the current in inductor L1 decreases with time. The current in inductor L1 flows to capacitor Co and the LED filament via diode D1. At this time, capacitor Co is in a status of energy storing.

It is noted that capacitor Co may be omitted. When capacitor Co is omitted and drain pin Pdrn and source pin Pcs are switched on, the current in inductor L1 does not flow through first driving output terminal 5231 and second driving output terminal 5232 to make the LED filament module not light. When drain pin Pdrn and source pin Pcs are switched off, the current in inductor L1 flows to the LED filament module via freewheeling diode D1 to light up the LED filament. By controlling lighting time of the LED filament and magnitude of the current flowing therethrough, the average intensity of the LED filament can be stabilized at a predetermined value to obtain an effect of identically stable lighting.

Biasing circuit 5533 includes diode D2, capacitor C1 and resistor R1. The anode and the cathode of diode D1 are electrically connected to first rectifying output terminal 5211 and first driving output terminal 5231, respectively. The first end and the second end of capacitor C1 are electrically connected to power pin Pvcc and ground pin Pgnd, respectively. The first end of resistor R1 is electrically connected to cathodes of diodes D1 and D2 and first driving output terminal 5231. The second end of resistor R1 is electrically connected to the first end of capacitor C1 and power pin Pvcc. Resistor R1 acquires a voltage of first driving output terminal 5231 to generate a working voltage Vcc. Working voltage Vcc is stabilized by capacitor C1 and transmitted to power pin Pvcc of controller 5431 for being used by controller 5431.

Sampling circuit 5534 includes resistor R2-R5. The first end and the second end of resistor R2 are electrically connected to first driving output terminal 5231 and overvoltage protection pin Povp, respectively. Resistors R3 and R4 are electrically connected in parallel. The first ends of resistors R3 and R4 are electrically connected to ground pin Pgnd. The second ends of resistors R3 and R4 are electrically connected to second filtering output terminal 5222, second driving output terminal 5232 and ground terminal GND. The first end and the second end of resistor R5 are electrically connected to ground pin Pgnd and both the second end of resistor R2 and overvoltage protection terminal Povp.

Resistors R2 to R5 acquire or sample a voltage of the output voltage (i.e. the voltage of first driving output terminal 5231) by voltage division. The sampled voltage is transmitted to overvoltage protection pin Povp of controller 5531. As a result, controller 5531 can determine if the overvoltage protection function should be executed or not according to a voltage of overvoltage protection pin Povp.

Additionally, driving circuits 5430, 5530 is shown by a single-stage DC-to-DC power conversion circuit as an example, but not limited to this. For example, driving circuit 5330 can be a two-stage power conversion circuit which includes an active power factor correction circuit and a DC-to-DC converter.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can applies some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. An LED light bulb, consisting of:
   a lamp housing with inner surface and outer surface opposite to the inner surface of the lamp housing, the inner surface of the lamp housing is doped with a golden yellow material or its surface coated with a yellow film;
   a bulb base connected to the lamp housing;
   a stem connected to the bulb base and located in the lamp housing, the stem comprises a stand extending to a center of the lamp housing;
   a single flexible LED filament, disposed in the lamp housing, the flexible LED filament comprising:
   a plurality of LED sections, each of the LED sections includes at least two LED chips that are electrically connected to each other by a first wire;
   a plurality of conductive sections, each of the conductive sections is located between the two adjacent LED sections and configured to electrically connect the two adjacent LED sections, each of the conductive section includes a conductor connecting the LED sections by a second wire;
   at least two conductive electrodes, respectively disposed corresponding to the LED sections and electrically connected to the LED section; and
   a column, coated on at least two sides of the LED chip and the conductive electrodes, and a portion of each of the conductive electrodes is not coated with the column, the column comprises a first light conversion layer corresponding to the LED sections and a second light conversion layer corresponding to the conductive sections, the first light conversion layer is harder than the second light conversion layer;
   two conductive supports, each of the two conductive suorts connected with the stem and the flexible LED filament;
   a driving circuit, electrically connected with both the two conductive supports and the bulb base; and
   a plurality of supporting arms, each of the supporting arms comprise a first end and a second end opposite to the first end of the supporting arms, the first end of each of the supporting arms is connected with the stand while the second end of each of the supporting arms is connected with the LED filament;
   wherein anodes of the LED sections are electrically connected together to serve as a first positive electrode P1 and/or a second positive electrode P2 of the flexible LED filament, cathodes of the LED section serve as a first negative electrode N1 and/or a second negative electrode N2, respectively, where the first positive electrode P1 and/or the second positive electrode P2, the first negative electrode N1 and/or the second negative electrode N2 are separately electrically connected to the driving circuit through the conductive supports, wherein a portion of the second wire is disposed in the first light conversion layer and another portion of the second wire is disposed in the second light conversion layer.

2. The LED light bulb according to claim 1, wherein the first light conversion layer has a better thermal conductivity than the second light conversion layer.

3. The LED light bulb according to claim 2, wherein a ratio R5 is defined as the ratio of the circumferential surface of the first light conversion layer to the total circumferential surface of the entire tubular encapsulation of the flexible LED filament, the ratio R5 is from 0.2 to 0.8.

4. The LED light bulb according to claim 3, wherein the ratio is in a range of 0.4 to 0.6.

5. The LED light bulb according to claim 4, wherein the first positive electrode P1 of the flexible LED filament is electrically connected to a first output terminal of driving circuit, where the first and second negative electrodes N1, N2 of the flexible LED filament are electrically connected together and jointly electrically connected to a second output terminal of driving circuit.

6. The LED light bulb according to claim 4, wherein the first positive electrode P1 of the flexible LED filament is electrically connected to a first output terminal of driving circuit, the first negative electrode N1 of the flexible LED filament is electrically connected to a second output terminal of driving circuit, and the second negative electrode N2 of the flexible LED filament electrically connected to a third output terminal of driving circuit.

7. The LED light bulb according to claim 6, wherein the second and third output terminals of driving circuit can be electrically connected together through a resistor and either of the second and third output terminals of the driving circuit is electrically connected to a ground terminal.

8. The LED light bulb according to claim 4, wherein the first positive electrode P1 and the second positive electrode P2 of the flexible LED filament are electrically connected together and jointly electrically connected to a first output terminal of driving circuit, the first negative electrode N1 of the flexible LED filament is electrically connected to a second output terminal of driving circuit.

9. The LED light bulb according to claim 4, wherein the first positive electrode P1 of the flexible LED filament is electrically connected to a first output terminal of driving circuit, the second positive electrode P2 of the flexible LED filament is electrically connected to a second output terminal of driving circuit, and the first negative electrode N1 of the flexible LED filament is electrically connected to a third output terminal of driving circuit.

10. The LED light bulb according to claim 4, wherein the first positive electrode P1 and the second positive electrode P2 of the flexible LED filament are electrically connected together and jointly electrically connected to a first output terminal of driving circuit, the first negative electrode N1 and the second negative electrode N2 of the flexible LED filament are electrically connected together and electrically connected to a second output terminal of driving circuit.

11. The LED light bulb according to claim 4, wherein the first positive electrode P1 and the second positive electrode P2 of the flexible LED filament are electrically connected together and jointly electrically connected to a first output terminal of driving circuit, the first negative electrode N1 of the flexible LED filament is electrically connected to a second output terminal of driving circuit, and the second negative electrode N2 of the flexible LED filament is electrically connected to a third output terminal of driving circuit.

12. The LED light bulb according to claim 11, wherein the spectral distribution of the LED light bulb is mainly between the wavelength range of about 400 nm to 800 nm, where there are three peak wavelengths P1, P2, P3 in wavelength ranges corresponding to the light emitted by the LED light bulb, the wavelength of the peak value P1 is between about 430 nm and 480 nm, the wavelength of the peak value P2 is between about 580 nm and 620 nm, and the wavelength of the peak value peak P3 is between about 680 nm and 750 nm, the light intensity of the peak P1 is less than that of the peak P2, and the light intensity of the peak P2 is less than the light intensity of the peak P3.

13. The LED light bulb according to claim 12, wherein points of the flexible LED filament in an xyz coordinates are defined as X, Y, and Z, an x-y plane of the xyz coordinates is perpendicular to the height direction of the light bulb, a z-axis of xyz coordinates is parallel with stand, the flexible LED filament comprise one conductive section and two LED sections, in the XY plane, the bending points of each of the LED sections and conductive electrodes are substantially on the circumference centered on the conductive section.

14. The LED light bulb according to claim 13, wherein the degree of the bending of the conductive section 130 is the same as or greater than the degree of the bending of the LED sections.

15. The LED light bulb according to claim 14, wherein the height of the conductive section is higher than the two conductive electrodes in the Z direction.

16. The LED light bulb according to claim 15, wherein the bending points of the two LED sections are at the same height in the Z direction.

17. The LED light bulb according to claim 16, wherein the height of the stand is corresponding to the height of the conductive section in the Z direction.

18. The LED light bulb according to claim 17, wherein the contour of the flexible LED filament in the XZ plane is similar to the V shape.

19. The LED light bulb according to claim 18, wherein the conductive sections is connected to the stand through the perforation of the top of the stand.

* * * * *